United States Patent
Liu et al.

(10) Patent No.: US 11,417,800 B2
(45) Date of Patent: Aug. 16, 2022

(54) MICRO SEMICONDUCTOR DEVICE AND MICRO SEMICONDUCTOR DISPLAY

(71) Applicant: PlayNitride Display Co., Ltd., Zhunan Township (TW)

(72) Inventors: Ying-Tsang Liu, Zhunan Township (TW); Pei-Hsin Chen, Zhunan Township (TW); Yi-Chun Shih, Zhunan Township (TW); Yi-Ching Chen, Zhunan Township (TW); Yu-Chu Li, Zhunan Township (TW); Tzu-Yang Lin, Zhunan Township (TW); Yu-Hung Lai, Zhunan Township (TW)

(73) Assignee: PLAYNITRIDE DISPLAY CO., LTD., Zhunan Township, Miaoli County (TW)

( * ) Notice: Subject to any disclaimer, the term of this patent is extended or adjusted under 35 U.S.C. 154(b) by 0 days.

(21) Appl. No.: 17/179,845

(22) Filed: Feb. 19, 2021

(65) Prior Publication Data
US 2021/0175391 A1  Jun. 10, 2021

Related U.S. Application Data

(63) Continuation-in-part of application No. 16/436,333, filed on Jun. 10, 2019, now Pat. No. 10,937,826.

(30) Foreign Application Priority Data

Dec. 4, 2018 (TW) .................................. 107143456

(51) Int. Cl.
*H01L 33/20* (2010.01)
*H01L 27/15* (2006.01)
(Continued)

(52) U.S. Cl.
CPC ............ *H01L 33/20* (2013.01); *H01L 27/156* (2013.01); *H01L 33/38* (2013.01); *H01L 33/62* (2013.01)

(58) Field of Classification Search
CPC ..... H01L 27/156; H01L 33/36; H01L 33/486; H01L 2933/0033; H01L 33/12
See application file for complete search history.

(56) References Cited

U.S. PATENT DOCUMENTS 8,789,573 B2 * 7/2014 Bibl .................... H01L 25/0753
156/752
8,934,259 B2 * 1/2015 Bower ................... H01L 21/563
430/48

(Continued)

FOREIGN PATENT DOCUMENTS

CN         108137311 A   6/2018
TW         I635605 B     9/2018

OTHER PUBLICATIONS

Chinese Office Action and Search Report dated Apr. 6, 2021 for Application No. 201811474668.4.

*Primary Examiner* — Edward Chin
(74) *Attorney, Agent, or Firm* — Birch, Stewart, Kolasch & Birch, LLP

(57) ABSTRACT

A micro semiconductor device and a micro semiconductor display are provided. The micro semiconductor device includes an epitaxial structure, a first electrode, a second electrode and a supporting layer. The epitaxial structure has a bottom surface and a top surface, wherein the bottom surface is defined as a central region and a peripheral region. A first electrode and a second electrode are disposed on the central region of the bottom surface of the epitaxial structure, or the first electrode is disposed on the central region of the bottom surface of the epitaxial structure and the second electrode is disposed on the top surface of the (Continued)

epitaxial structure. The supporting layer is disposed on the peripheral region of the bottom surface of the epitaxial structure.

18 Claims, 25 Drawing Sheets

(51) Int. Cl.
  *H01L 33/62* (2010.01)
  *H01L 33/38* (2010.01)

(56) References Cited

U.S. PATENT DOCUMENTS

| | | | |
|---|---|---|---|
| 9,768,345 B2* | 9/2017 | Hu | H01L 33/405 |
| 10,297,722 B2* | 5/2019 | Chang | H04N 5/64 |
| 10,903,267 B2* | 1/2021 | Wu | H01L 33/50 |
| 2010/0078670 A1* | 4/2010 | Kim | H01L 33/46 |
| | | | 257/E33.059 |
| 2011/0297914 A1* | 12/2011 | Zheng | H01L 33/46 |
| | | | 257/13 |
| 2012/0314388 A1* | 12/2012 | Bower | H05K 3/20 |
| | | | 156/219 |
| 2013/0130440 A1* | 5/2013 | Hu | H01L 24/95 |
| | | | 438/107 |
| 2013/0285086 A1* | 10/2013 | Hu | H01L 24/75 |
| | | | 438/34 |
| 2019/0189496 A1* | 6/2019 | Chen | H01L 21/6835 |
| 2020/0321489 A1* | 10/2020 | Wang | H01L 21/68714 |

\* cited by examiner

MICRO SEMICONDUCTOR DEVICE AND MICRO SEMICONDUCTOR DISPLAY

CROSS REFERENCE TO RELATED APPLICATIONS

This application is a Continuation-In-Part of pending U.S. patent application Ser. No. 16/436,333, filed Jun. 10, 2019 and entitled "micro semiconductor structure", the entirety of which is incorporated by reference herein, which claims the benefit of Taiwan Patent Application No. 107143456, filed on Dec. 4, 2018, which is hereby incorporated by reference herein

BACKGROUND

Field of the Disclosure

The present disclosure relates to a micro semiconductor device and a micro semiconductor display.

Description of the Related Art

With the advancements being made in the field of optoelectronic technology, the size of optoelectronic components has gradually evolved toward miniaturization. In recent years, due to breakthroughs in the size of light-emitting diodes (LEDs), the micro light-emitting diodes (micro LED) displays in which arrays of light-emitting diodes are arranged in an array have increasingly interested people in the field. A micro LED display is an active micro semiconductor device display, and it is more energy efficient than organic light-emitting diodes (OLED) displays. Furthermore, a micro LED display has better contrast performance than an OLED display, and it is visible under in sunlight. In addition, since micro LED displays use inorganic material, they have better reliability and a longer lifetime than OLED displays.

Micro devices (such as micro light-emitting diodes) may be fixed on a temporary carrier by means of a supporting structure, thereby facilitating the transfer of the micro devices from the temporary carrier to a receiving substrate. In general, the supporting structure is disposed on both sides of the micro devices. Therefore, the micro devices could not be densely arranged on the temporary carrier, resulting in a reduction in the integration density of the micro devices. In addition, a novel structure is needed for easily and efficiently transporting and transferring the micro devices between the temporary carrier and the receiving substrate.

BRIEF SUMMARY

The disclosure provides a micro semiconductor structure. In some embodiments, the micro semiconductor structure can include a substrate, at least one supporting layer, and at least one micro semiconductor device. The supporting layer is disposed on the top surface of the substrate, wherein supporting layer consists of at least one upper portion and a bottom portion, and wherein the upper portion extends in a first direction. The length L1 of the upper portion in the first direction is longer than the length L2 of the bottom portion in the first direction. In addition, the bottom surface of the micro semiconductor device is in direct contact with the upper portion of the supporting layer. The micro semiconductor device has a first electrode and a second electrode, wherein the first electrode and the second electrode are disposed on the same surface (such as the bottom surface) of the micro semiconductor device, or the first electrode is disposed on the bottom surface of the micro semiconductor device and the second electrode is disposed on the top surface of the micro semiconductor device.

According to embodiments of the disclosure, the ratio of the length L2 of the bottom portion of the supporting layer in the first direction to the length L1 of the upper portion of the supporting layer in the first direction is greater than or equal to about 0.05 and less than or equal to about 0.5.

According to embodiments of the disclosure, the bottom surface of the micro semiconductor device has at least one first region which is an interface between the bottom surface of the micro semiconductor device and the upper portion. Namely, the first region is the part of the bottom surface of the micro semiconductor device which is in direct contact with the upper portion of the supporting layer. The ratio (A1/A2) of the surface area A1 of the first region to the surface area A2 of the bottom surface of the micro semiconductor device is greater than or equal to about 0.05 and less than or equal to 0.5, such as from about 0.05 to 0.5, from about 0.05 to 0.3, from about 0.1 to 0.3, or from about 0.2 to 0.5.

According to some embodiments of the disclosure, the bottom surface of the micro semiconductor device has at least two first regions, wherein the first regions are spaced apart from each other.

According to embodiments of the disclosure, the first region has a length L3 in the first direction. There is a minimum distance D1 between the first region and the bottom portion of the supporting layer in the first direction. In particular, the ratio (L3/(L3+D1)) of the length L3 of the first region in the first direction to the sum of the length L3 of the first region in the first direction and the minimum distance D1(L3+D1) is greater than or equal to about 0.2 and less than or equal to about 0.8.

According to some embodiments of the disclosure, the length L3 is less than or equal to about 5 μm, such as from about 0.5 μm to 5 μm, from about 1 μm to 5 μm, or from about 1 μm to 3 μm. The minimum distance D1 is less than or equal to about 25 μm, such as from about 0.5 μm to 5 μm, from about 5 μm to 25 μm, or from about 10 μm to 15 μm.

According to embodiments of the disclosure, the bottom surface of the micro semiconductor device has at least two first regions, wherein the first regions are spaced apart from each other.

According to embodiments of the disclosure, the first electrode has a thickness T1, the second electrode has a thickness T2, and the upper portion of the supporting layer has a thickness T3, wherein the thickness T1 of the first electrode is greater than the thickness T3 of the upper portion of the supporting layer.

According to some embodiments of the disclosure, when the second electrode is disposed on the bottom surface of the micro semiconductor device, the thickness T2 of the second electrode is greater than the thickness T3 of the upper portion of the supporting layer.

According to embodiments of the disclosure, the bottom portion of the supporting layer has a thickness T4, and the sum of the thickness T3 of the upper portion and the thickness T4 of the bottom portion is greater than the thickness T1 of the first electrode.

According to some embodiments of the disclosure, the sum of the thickness T3 of the upper portion and the thickness T4 of the bottom portion is greater than the thickness T2 of the second electrode, when the second electrode is disposed on the bottom surface of the micro semiconductor device.

According to embodiments of the disclosure, the upper portion of the supporting layer is made of a first material, and the bottom portion of the supporting layer is made of a second material. According to other embodiments of the disclosure, the first material is distinct from the second material, and the Young's modulus of the first material is less than the Young's modulus of the second material.

According to embodiments of the disclosure, an orthogonal projection of the bottom surface of the micro semiconductor device onto the substrate does not overlap an orthogonal projection of the bottom portion of the supporting layer onto the substrate.

According to embodiments of the disclosure, the first electrode and the second electrode do not come into direct contact with the supporting layer.

According to embodiments of the disclosure, the micro semiconductor device has a surrounding surface joining the top surface of the micro semiconductor device and the bottom surface of the micro semiconductor device, and wherein the supporting layer does not contact the top surface of the micro semiconductor device or the surrounding surface of the micro semiconductor device.

According to embodiments of the disclosure, the bottom surface of the micro semiconductor device has a second region disposed between the first electrode and the second electrode, and the second region does not directly contact the supporting layer, when the first electrode and the second electrode are disposed on the bottom surface of the micro semiconductor device.

According to embodiments of the disclosure, the disclosure also provides a micro semiconductor device. The micro semiconductor device includes an epitaxial structure, a first electrode, a second electrode and a supporting layer. The epitaxial structure has a bottom surface and a top surface, wherein the bottom surface is defined as a central region and a peripheral region. A first electrode and a second electrode are disposed on the central region of the bottom surface of the epitaxial structure, or the first electrode is disposed on the central region of the bottom surface of the epitaxial structure and the second electrode is disposed on the top surface of the epitaxial structure. The supporting layer is disposed on the peripheral region of the bottom surface of the epitaxial structure.

According to embodiments of the disclosure, the supporting layer does not contact the first electrode and the second electrode.

According to embodiments of the disclosure, the first electrode and second electrode have a first height H1, the supporting layer has a second height H2, and the ratio (H1/H2) of the first height H1 to the second height H2 is 0.8 to 1.2

According to embodiments of the disclosure, the supporting layer is discontinuously arranged on the peripheral region.

According to embodiments of the disclosure, the supporting layer includes a first portion and a second portion, and the central region is disposed between an orthogonal projection of the first portion onto the bottom surface of the epitaxial structure and an orthogonal projection of the second portion onto the bottom surface of the epitaxial structure.

According to embodiments of the disclosure, the first electrode and the second electrode are disposed on the bottom surface of the epitaxial structure, an orthogonal projection of the first electrode onto the bottom surface has a first center, and an orthogonal projection of the second electrode onto the bottom surface has a second center. The orthogonal projection of the first portion onto the bottom surface of the epitaxial structure and the orthogonal projection of the second portion onto the bottom surface of the epitaxial structure simultaneously overlap an extension line passing through the first center and the second center.

According to embodiments of the disclosure, the supporting layer is continuously arranged on the peripheral region. Further, an orthogonal projection of the supporting layer onto the bottom surface of the epitaxial structure surrounds the central region.

According to embodiments of the disclosure, the micro semiconductor device further includes a filling layer disposed on the central region of the bottom surface of the epitaxial structure.

According to embodiments of the disclosure, the first electrode and the second electrode are disposed on the bottom surface of the epitaxial structure, and the filling layer is disposed between the first electrode and the second electrode.

According to embodiments of the disclosure, the filling layer directly contacts the first electrode and the second electrode.

According to embodiments of the disclosure, the filling layer does not directly contact the first electrode and the second electrode.

According to embodiments of the disclosure, the filling layer has a third height H3, and the ratio (H1/H3) of the first height H1 to the third height H3 is 0.8 to 1.2.

According to embodiments of the disclosure, a micro semiconductor display is provided. The micro semiconductor display includes a display substrate having a top surface, a plurality of contact pads disposed on the top surface of the display substrate, and a plurality of the aforementioned micro semiconductor devices, wherein each of the first electrodes of the epitaxial structure is directly bonded with one of the contact pads.

According to embodiments of the disclosure, a part of the first electrode is disposed between the supporting layer and the contact pad. In addition, a cross-section of the first electrode can be L-shape.

According to embodiments of the disclosure, an orthogonal projection of the supporting layer onto the display substrate overlaps an orthogonal projection of the contact pad onto the display substrate.

According to embodiments of the disclosure, each of the second electrodes is disposed on the central region of the bottom surface of the epitaxial structure and directly bonded with one of the contact pads. Moreover, a part of the second electrode is disposed between the supporting layer and the contact pad, and a cross-section of the second electrode can be L-shape.

BRIEF DESCRIPTION OF THE DRAWINGS

A detailed description is given in the following embodiments with reference to the accompanying drawings. It should be emphasized that many features are not drawn to scale according to industry standard practice. In fact, the dimensions of the various components may be arbitrarily increased or decreased for clarity of discussion.

DETAILED DESCRIPTION

Figure 1:
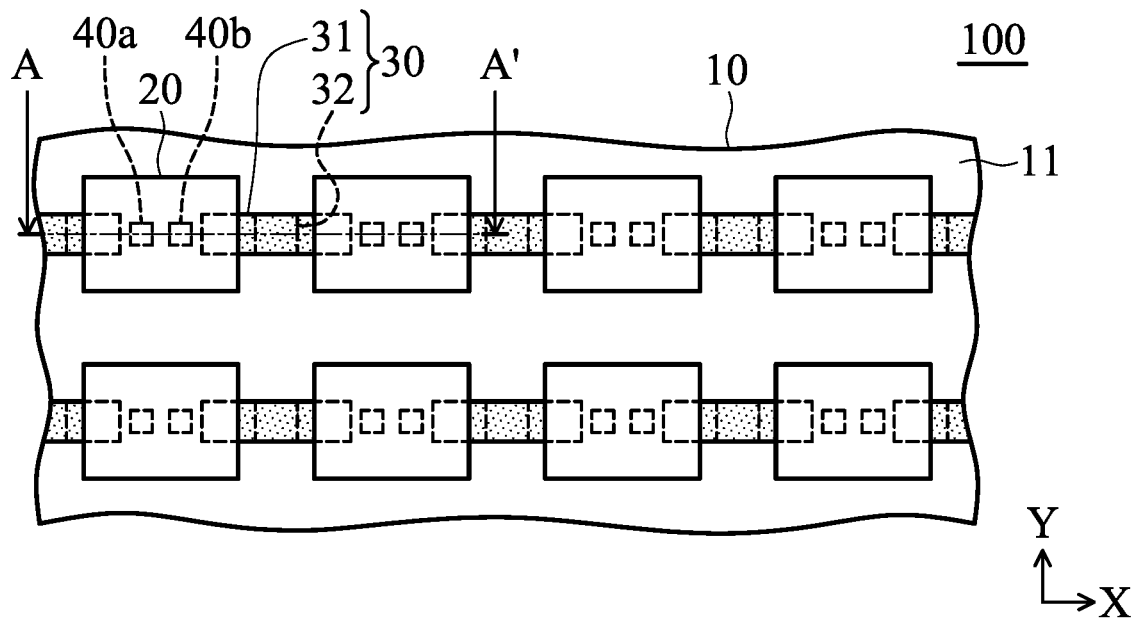
FIG. 1 is a top view of a micro semiconductor structure in accordance with one embodiment of the disclosure.

The micro semiconductor device of the disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer" may refer to a layer that is in direct contact with the other layer, and they may also refer to a layer that does not directly contact the other layer, there being one or more intermediate layers disposed between the layer and the other layer.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to particular embodiments and with reference to certain drawings but the disclosure is not limited thereto.

Furthermore, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

The disclosure provides a micro semiconductor structure having micro semiconductor devices. The micro semiconductor devices (such as a micro LED or micro chip) are fixed on a substrate (such as a temporary carrier). The micro semiconductor devices are spaced apart from each other by a predetermined distance. As a result, the specific micro semiconductor structure can prevent the micro semiconductor devices from being damaged during the subsequent transferring process.

In addition, the micro semiconductor devices of the micro semiconductor structure of the disclosure can be transferred easily from a temporary carrier to a receiving substrate. It should be noted that, in the micro semiconductor structure of the disclosure, the supporting layer is disposed on the bottom surface of the micro semiconductor device rather than sidewalls of the micro semiconductor device. As a result, the amount of the micro semiconductor devices disposed on the temporary carrier can be increased on the premise that the success rate of the process for transporting and transferring the micro semiconductor devices is not reduced.

The "micro" semiconductor device of the disclosure means a semiconductor device which has a length, width and height within a range of 1 μm to 100 μm. According to embodiments of the disclosure, the micro semiconductor device may have a maximum width of 20 μm, 10 μm, or 5 μm. In some embodiments, the micro semiconductor device 20 may have a maximum height of 10 μm or 5 μm. However, it should be understood that embodiments of the present invention are not limited thereto, and aspects of certain embodiments may be applied to larger and perhaps smaller scales.

According to embodiments of the disclosure, the receiving substrate may be, for example, a display substrate, a light-emitting substrate, a substrate having a functional element (such as a thin film transistor or an integrated circuit), or other types of circuit substrates, but the receiving substrate is not limited to the above-mentioned type. Although some embodiments of the disclosure specifically describe a micro semiconductor device including a p-n epitaxial structure, it should be understood that embodiments of the disclosure are not limited to these embodiments, and certain embodiments may be applied to another micro semiconductor devices, including a micro semiconductor device (for example, a diode, a transistor, or an integrated circuit) which can be controlled to perform predetermined electronic functions or a micro semiconductor device 20 (for example, a light-emitting diode, a laser diode, or a photodiode) which can be controlled to perform predetermined opto-electronic functions. Other embodiments of the invention may also be applied to microchips including circuits, such as microchips using silicon or semiconductor-on-insulator (SOI) wafers as the material and used in logic or memory applications or microchips using gallium arsenide (GaAs) wafers as a material and used in RF communication applications.

Figure 2:
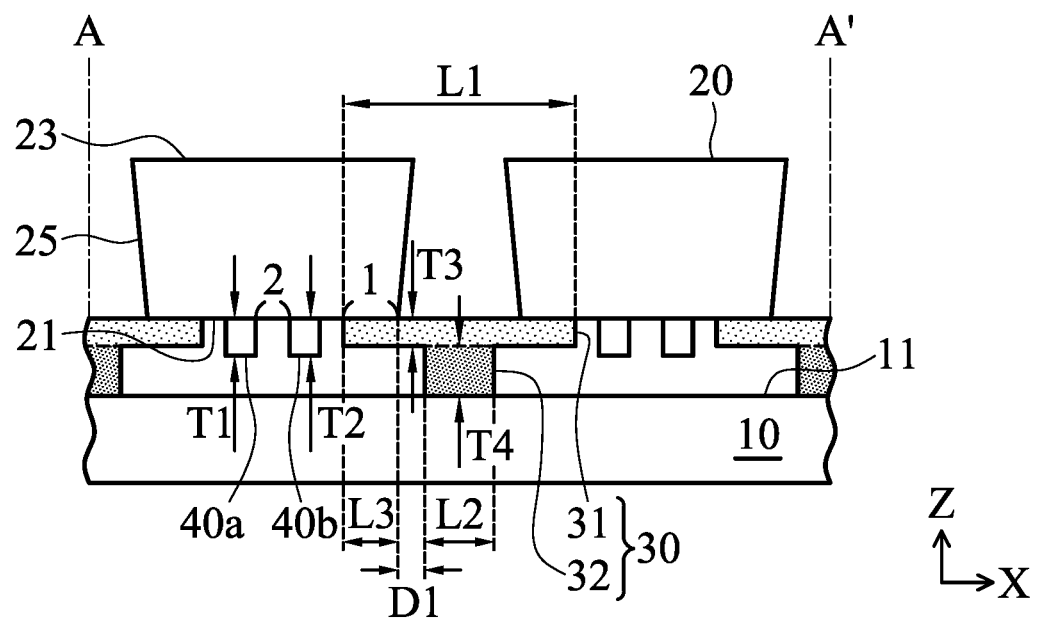
FIG. 2 is a cross-sectional view of the micro semiconductor structure taken along line A-A' of FIG. 1.

FIG. 1 is a top view of a micro semiconductor structure 100 in accordance with one embodiment of the disclosure, and FIG. 2 is a cross-sectional view of the micro semiconductor structure 100 taken along line A-A' of FIG. 1. As shown in FIG. 1, the micro semiconductor structure 100 of the disclosure can include a substrate 10, the micro semiconductor devices 20, and a supporting layer 30. According to embodiments of the disclosure, the substrate 10, for example, can be a temporary carrier for carrying the micro semiconductor devices 20 and the supporting layers 30. The substrate 10, for example, can be a plastic substrate, a glass substrate, a sapphire substrate, or another substrate having no circuits.

As shown in FIG. 1, the supporting layer 30 is disposed on the top surface 11 of the substrate 10, and the supporting layer 30 is formed between the substrate 10 and the micro semiconductor device 20. The supporting layer 30 can consist of the upper portion 31 and the bottom portion 32. The upper portion 31 of the supporting layer 30 can be made of a first material and the bottom portion 32 of the supporting layer 30 can be made of a second material. The first material and second material can be independently organic material (such as benzocyclobutene, phenol formaldehyde resin, epoxy resin, polyisoprene rubber or a combination thereof), inorganic material (such as silicon oxide, silicon nitride, silicon oxynitride, or a combination thereof), other thermal denatured material (such as cold-short material, hot melting material, photoresist material, or a combination thereof), or a combination thereof. The upper portion 31 of the supporting layer 30 extends in a First direction, and the upper portion 31 is in direct contact with the micro semiconductor device 20 in order to support and hold the micro semiconductor device 20. The bottom portion 32 of the supporting layer 30 is in direct contact with the top surface 11 of the substrate 10 in order to support the upper portion 31. In addition, an orthogonal projection of the bottom surface 21 of the micro semiconductor device 20 onto the substrate 10 does not overlap an orthogonal projection of the bottom portion 32 of the supporting layer 30 onto the substrate 10. According to embodiments of the disclosure, orthogonal projections of the two adjacent upper portions 31 of the supporting layer 30 onto the substrate 10 are spaced apart from each other. Therefore, the upper portion 31 of the supporting layer 30 is discontinuous.

As shown in FIG. 2, the upper portion 31 of the supporting layer 30 has a length (such as the maximum length) L1 in the first direction X, and the bottom portion 32 of the supporting layer 30 has a length (such as the maximum length) L2 in the first direction X, wherein the length L1 of the upper portion 31 in the first direction X is greater than the length L2 of the bottom portion 32 in the first direction X. According to embodiments of the disclosure, the ratio (L2/L1) of the length L2 of the bottom portion 32 in the first direction X to the length L1 of the upper portion 31 in the first direction X is greater than or equal to about 0.05 and less than or equal to 0.5, such as from about 0.05 to 0.5, from about 0.05 to 0.3, from about 0.1 to 0.3, or from about 0.2 to 0.5. It should be noted that, when the ratio (L2/L1) of the length L2 of the bottom portion 32 in the first direction X to the length L1 of the upper portion 31 in the first direction X is too large, the micro semiconductor device 20 is not apt to be transferred from the substrate 10 to a receiving substrate in subsequent processes. When the ratio (L2/L1) of the length L2 of the bottom portion 32 in the first direction X to the length L1 of the upper portion 31 in the first direction X is too small, the bottom portion 32 would not be able to support the upper portion 31. According to embodiments of the disclosure, as shown in FIGS. 1 and 2, the projection of the upper portion 31 and the bottom portion 32 of the supporting layer 30 in a second direction Y is T-shaped which has a greater upper width and a smaller bottom W width (i.e. the profile of the supporting layer 30 in the first direction X is T-shaped), wherein the first direction X is orthogonal to the second direction Y, and the first direction X and the second direction Y are parallel to the top surface 11 of the substrate 10. The term "orthogonal to" refers to an angle between the first direction and the second direction within the range of 90±5 degrees.

According to embodiments of the disclosure, the first material of the upper portion 31 and the second material of the bottom portion 32 are the same. For example, the upper portion 31 of the supporting layer 30 and the bottom portion 32 of the supporting layer 30 can be seamless. According to some embodiments of the disclosure, the first material of the upper portion 31 is distinct from the second material of the bottom portion 32. Namely, the upper portion 31 of the supporting layer 30 and the bottom portion 32 of the supporting layer 30 are made of different materials by different processes. According to embodiments of the disclosure, the Young's modulus of the first material (the upper portion 31) is less than the Young's modulus of the second material (the bottom portion 32). Therefore, the rigidity of the first material (the upper portion 31) is less than the rigidity of the second material (the bottom portion 32), and the toughness of the first material (the upper portion 31) is greater than the toughness of the second material (the bottom portion 32). For example, the first material (the upper portion 31) can be photoresist material or other thermal denatured material, and the second material (the bottom portion 32) can be inorganic material. When the upper portion 31 of the supporting layer 30 has a relatively high toughness, it can effectively provide a good buffering ability between the micro semiconductor device 20 and the bottom portion 32 of the supporting layer 30, thereby preventing the upper portion 31 of the supporting layer 30 from cracking due to the external force while fixing and supporting the micro semiconductor device 20. When the bottom portion 32 of the supporting layer 30 has a relatively high toughness, the bottom portion 32 can effectively support and hold the micro semiconductor device 20. As a result, since the supporting layer 30 of the disclosure can consist of materials which have various degrees of Young's modulus, toughness and rigidity, the supporting layer 30 can affix and support the micro semiconductor device 20 effectively and prevent the micro semiconductor device 20 from cracking, thereby facilitating the transfer of the micro semiconductor device 20 between different substrates. The Young's modulus of the material is determined according to ASTM D882-12, the rigidity of the material is determined according to ASTM D790, and toughness (fracture toughness) is determined according to ASTM D 5045.

According to embodiments of the disclosure, the supporting layer 30 can be formed and fixed onto the top surface 11 of the substrate 10. Next, the micro semiconductor device 20 is disposed on the supporting layer 30 over the substrate 10, and the micro semiconductor device 20 are supported and held by the upper portion 31 of the supporting layer 30. The bottom surface 21 of the micro semiconductor device 20 is in direct contact with the upper portion 31 of the supporting layer 30.

According to some embodiments of the disclosure, when the first material of the upper portion 31 and the second material of the bottom portion 32 are different, the first material can be formed and fixed on the bottom surface 21 of the micro semiconductor device 20, and the second material can be formed on the top surface 11 of the substrate 10. Next, the micro semiconductor device 20 (with the first material) is disposed on the substrate 10, resulting in the first material being in direct contact with the second material to constitute the supporting layer 30 (i.e. the upper portion 31 of the supporting layer 30 is made of the first material, and the bottom portion 32 of the supporting layer 30 is made of the second material), obtaining the micro semiconductor structure 100. As a result, the micro semiconductor device 20 is firmly fixed on the substrate 10 by means of the supporting layer 30.

According to embodiments of the disclosure, in the subsequent transferring process, the upper portion 31 of the supporting layer 30 can be partially or completely separated from the substrate 10. Namely, the upper portion 31 of the supporting layer 30 can be partially or completely transferred to the receiving substrate along with the micro semiconductor device 20.

According to some embodiments of the disclosure, in the subsequent transferring process, the whole upper portion 31 of the supporting layer 30 may remain on the substrate 10. Therefore, the upper portion 31 of the supporting layer 30 does not be transferred to the receiving substrate along with the micro semiconductor device 20. According to embodiments of the disclosure, the micro semiconductor device 20 (such as a micro light-emitting semiconductor device) can be transferred to a receiving substrate (such as a display substrate), thereby forming a semiconductor device (such as a Micro LED display).

As shown in FIG. 2, the micro semiconductor device 20 has a bottom surface 21, a top surface 23 and a surrounding surface 25 joining the bottom surface 21 of the micro semiconductor device 20 and the top surface 23 of the micro semiconductor device 20. The micro semiconductor device 20 can have a first electrode 40a and a second electrode 40b, wherein the first electrode 40a and the second electrode 40b have opposite electrical charges. In the embodiment of FIG. 1, the first electrode 40a and the second electrode 40b are disposed on the bottom surface 21 of the micro semiconductor device 20, and the first electrode 40a and the second electrode 40b are disposed on the bottom surface 21 of the micro semiconductor device 20 in the first direction X. The bottom surface 21 of the micro semiconductor device 20 is in direct contact with the upper portion 31 of the supporting layer 30.

According to embodiments of the disclosure, the orthogonal projections of the first electrode 40a and the second electrode 40b onto the substrate 10 do not overlap the orthogonal projection of the bottom portion 32 of the supporting layer 30 onto the substrate 10. According to embodiments of the disclosure, the orthogonal projections of the first electrode 40a and the second electrode 40b onto the substrate 10 do not overlap the orthogonal projection of the upper portion 31 of the supporting layer 30 onto the substrate 10. According to embodiments of the disclosure, the upper portion 31 of the supporting layer 30 does not is in direct contact with the first electrode 40a or the second electrode 40b, in order to prevent the first electrode 40a or the second electrode 40b from electrically connecting with the conductive circuits disposed on the receiving substrate. According to embodiments of the disclosure, the supporting layer 30 does not is in direct contact with the micro semiconductor device 20p surface 23. According to some embodiments of the disclosure, the supporting layer 30 does not is in direct contact with the surrounding surface 25 of the micro semiconductor device 20. Namely, the supporting layer 30 does not be disposed on the sidewalk of the micro semiconductor device 20. The supporting layer 30 is merely disposed on the bottom surface 21 of the micro semiconductor device 20. As a result, besides providing supporting and fixing effects, the supporting layer 30 of the disclosure facilitates a dense arrangement of the micro semiconductor devices 20 on the substrate 10 (increasing the amount of the micro semiconductor devices 20 disposed on the substrate 10), since the supporting layer 30 would not be disposed on the sidewalls of the micro semiconductor device 20 and the space adjacent to the sidewalls of the micro semiconductor device 20 would not be occupied.

Figure 3:
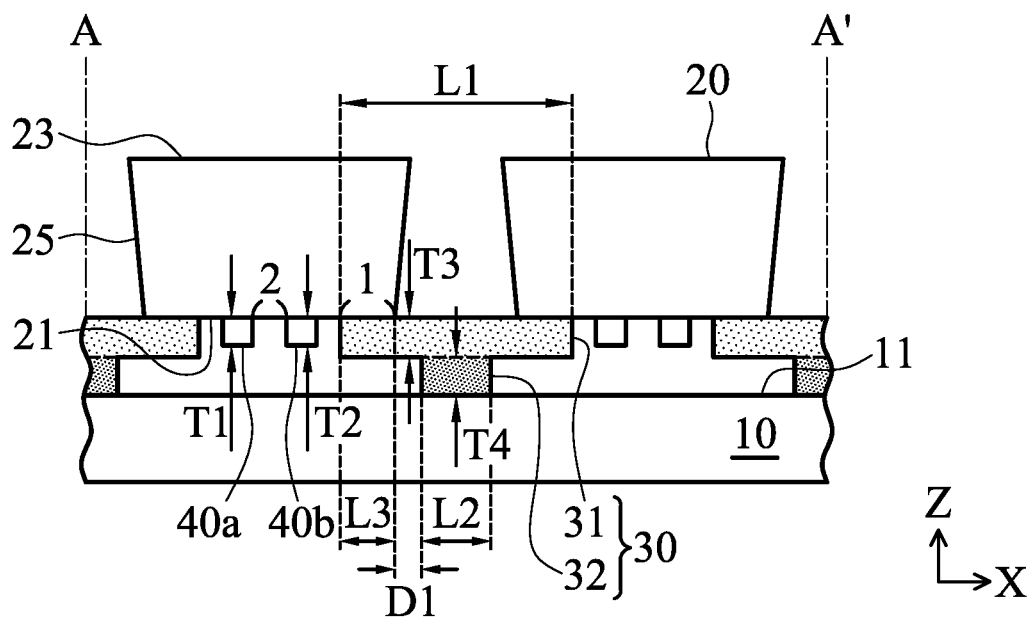
FIG. 3 is a cross-sectional view of the micro semiconductor structure in accordance with another embodiment of the disclosure.

As still shown in FIG. 2, the first electrode 40a has a thickness T1, the second electrode 40b has a thickness T2, the upper portion 31 of the supporting layer 30 has a thickness T3, and the bottom portion 32 of the supporting layer 30 has a thickness T4. The thickness T1 of the first electrode 40a is different from or the same as the thickness T2 of the second electrode 40b. Herein, the term "thickness of electrode" means the maximum distance between the electrode and the bottom surface 21 of the micro semiconductor device 20 in a third direction Z, wherein the third direction Z is orthogonal to the first direction X, and the third direction Z is perpendicular to the top surface 11 of the substrate 10. According to embodiments of the disclosure, the thickness T3 of the upper portion 31 of the supporting layer 30 is less than the thickness T1 of the first electrode 40a, and the thickness T3 of the upper portion 31 of the supporting layer 30 is also less than the thickness T2 of the first electrode 40b, as shown in FIG. 2. For example, the ratio (T3/T1) of the thickness T3 to the thickness T1 (or the ratio (T3/T2) of the thickness T3 to the thickness T2) can be from about 0.2 to 0.8. As a result, when the upper portion 31 of the supporting layer 30 is transferred to a receiving substrate along with the micro semiconductor device 20, the remaining upper portion 31 of the supporting layer 30 would not further disrupt the electrical connection between the micro semiconductor device 20 and conductive circuits disposed on the receiving substrate. According to some embodiments of the disclosure, when the material of the upper portion 31 of the supporting layer 30 (the first material) is organic material or other thermal denatured material (such as cold-short material, hot melting material, photoresist material, or a combination thereof), the thickness T3 of the upper portion 31 of the supporting layer 30 can be greater than or equal to the thickness T1 of the first electrode 40a, and the thickness T3 of the upper portion 31 of the supporting layer 30 can be greater than or equal to the thickness T2 of the first electrode 40b, as shown in FIG. 3. For example, the ratio (T3/T1) of the thickness T3 to the thickness T1 (or the ratio (T3/T2) of the thickness T3 to the thickness T2) can be from about 1 to 1.5. As a result, when transferring the micro semiconductor device 20 to the receiving substrate, the upper portion 31 of the supporting layer 30 can serve as a buffer layer since the material of the upper portion 31 of the supporting layer 30 is organic material or other thermal denatured material (such as cold-short material, hot melting material, photoresist material, or a combination thereof). After, the upper portion 31 of the supporting layer 30 can be removed by a heating or cooling treatment.

When the upper portion 31 of the supporting layer 30 is a cold-short material, the upper portion 31 can be removed by a cooling treatment. The temperature of the cooling treatment can be, for example, from about −100° C. to about 0° C. When the upper portion 31 of the supporting layer 30 is a hot melting material, the upper portion 31 can be removed by a heating treatment. The temperature of the heating treatment depends on the melting point of the hot material and can be, for example, from about 40° C. to 300° C., or from about 50° C. to 180° C. When the upper portion 31 of the supporting layer 30 is a photoresist material, the upper portion 31 can be removed by subjecting the upper portion 31 to a heating process, wherein the temperature of the heating treatment depends on the decomposition temperature of the photoresist material and can be, for example, from about 80° C. to 400° C. or from about 150° C. to 300° C.

According to embodiments of the disclosure, the sum of the thickness T3 of the upper portion 31 of the supporting layer 30 and the thickness T4 of the bottom portion 32 of the supporting layer 30 (i.e. the thickness of the supporting layer 30 (T3+T4)) is greater than the thickness T1 of the first electrode 40a, and the sum of the thickness T3 of the upper portion 31 of the supporting layer 30 and the thickness T4 of the bottom portion 32 of the supporting layer 30 is greater than the thickness T2 of the first electrode 40b. For example, the ratio of the thickness T1 (or T2) to the thickness (T3+T4) of the supporting layer 30 can be about 0.2 to 0.8. As a result, the supporting layer 30 can elevate the micro semiconductor device 20 to prevent the first electrode 40a and the second electrode 40b from directly contacting the substrate 10. Thus, the first electrode 40a and the second electrode 40b would not be damaged by the substrate 10. In addition, the micro semiconductor device 20 is apt to be picked or transferred easily, thereby facilitating the transfer of the micro semiconductor device 20 from the substrate 10 to the receiving substrate.

Figure 4:
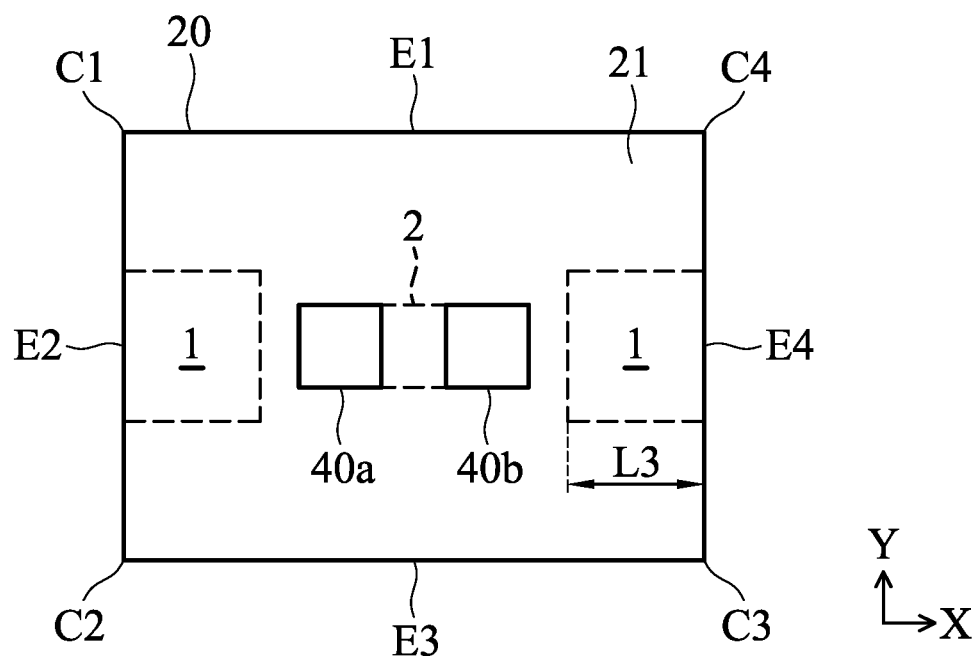
FIG. 4 is a bottom view of any one of the micro semiconductor devices of the micro semiconductor structure of FIG. 1.

FIG. 4 is a bottom view of any one of the micro semiconductor devices 20 of the micro semiconductor structure 100 of FIG. 1. The supporting layer 30 and the substrate 10 are not shown in FIG. 4 for convenience of illustration. As shown in FIGS. 2 and 4, the bottom surface 21 of the micro semiconductor device 20 has at least one first region 1 which is an interface between the bottom surface of the micro semiconductor device 20 and the upper portion 31 (i.e. the area of the bottom surface 21, which is in direct contact with to the upper portion 31, is defined as the first region 1). The first region 1 has a length L3 in the first direction X (i.e. the length of the upper portion 31, which is covered by the bottom surface 21 of the micro semiconductor device 20, in the first direction X), and there is a minimum distance D1 between the first region 1 and the bottom portion 32 of the supporting layer 30 in the first direction X (i.e. the distance from the micro semiconductor device 20 to the bottom portion 32 in the first direction X). According to embodiments of the disclosure, the ratio (L3/(L3+D1)) of the length of the first region in the first direction (L3) to the sum of the length of the first region in the first direction (L3) and the minimum distance (D1) is greater than or equal to about 0.2 and less than or equal to 0.8, such as from about 0.2 to 0.5, from about 0.5 to 0.8, or from about 0.2 to 0.8. As a result, the micro semiconductor device 20 can be fully supported and held by the upper portion 31 of the supporting layer 30 and the micro semiconductor device 20 is firmly fixed on the substrate 10 by means of the supporting layer 30. Therefore, the micro devices would be densely arranged on the substrate 10. According to embodiments of the disclosure, in order to avoid increasing the contact area (i.e. the first region) resulting in the subsequent transferring process being more difficult, the length L3 can be less than or equal to about 5 μm, such as from about 0.5 μm to 5 μm, from about 1 μm to 5 μm, or from about 1 μm to 3 μm, and the minimum distance D1 can be less than or equal to about 25 μm, such as from about 0.5 μm to 5 μm, from about 5 μm to 25 μm, or from about 10 μm to 15 μm.

As still shown in FIG. 4, according to embodiments of the disclosure, the ratio (A1/A2) of the surface area A1 of the first region 1 to the surface area A2 of the bottom surface 21 of the micro semiconductor device 20 is greater than or equal to about 0.05 and less than or equal to 0.5, such as from about 0.05 to 0.5, from about 0.1 to 0.5, from about 0.2 to 0.5, or from about 0.25 to 0.5. When the contact area between the upper portion 31 of the supporting layer 30 and the micro semiconductor device 20 is too large, the difficulty of subsequent transferring process would be increased. Furthermore, when the contact area between the upper portion 31 of the supporting layer 30 and the micro semiconductor device 20 is too small, the supporting layer 30 would provide a poor fixing and supporting effect.

As shown in FIG. 4, the bottom surface 21 of the micro semiconductor device 20 has four edges E1, E2, E3 and E4 and four vertices C1, C2, C3 and C4. The edge E1 of the bottom surface 21 is positioned opposite the edge E3 of the bottom surface 21, and the edge E2 of the bottom surface 21 is positioned opposite the edge E4 of the bottom surface 21. The vertex C1 of the micro semiconductor device 20 is defined by the intersection of the edge E1 and the edge E2, the vertex C2 of the micro semiconductor device 20 is defined by the intersection of the edge E2 and the edge E3, the vertex C3 of the micro semiconductor device 20 is defined by the intersection of the edge E3 and the edge E4, and the vertex C4 of the micro semiconductor device 20 is defined by the intersection of the edge E4 and the edge E1. Namely, a straight line connecting the vertices C1 and C3 overlaps one diagonal of the bottom surface 21 of the micro semiconductor device 20, and a straight line connecting the vertices C2 and C4 overlaps another diagonal of the bottom surface 21 of the micro semiconductor device 20. According to embodiments of the disclosure, the bottom surface 21 of the micro semiconductor device 20 can have two first regions 1, and the two first regions 1 directly contact the edges E2 and E4 of the bottom surface 21 respectively, as shown in FIG. 4.

As shown in FIGS. 2 and 4, the area of the bottom surface 21 between the first electrode 40a and the second electrode 40b is defined as a second region 2. Herein, a projection of the second region 2 in the first direction X completely overlaps a projection of the bottom surface 21 occupied by the first electrode 40a (or the second electrode 40b) in the first direction X. According to embodiments of the disclosure, the supporting layer 30 does not is in direct contact with the second region 2. Namely, the first region 1 does not overlap the second region 2.

Figure 5:
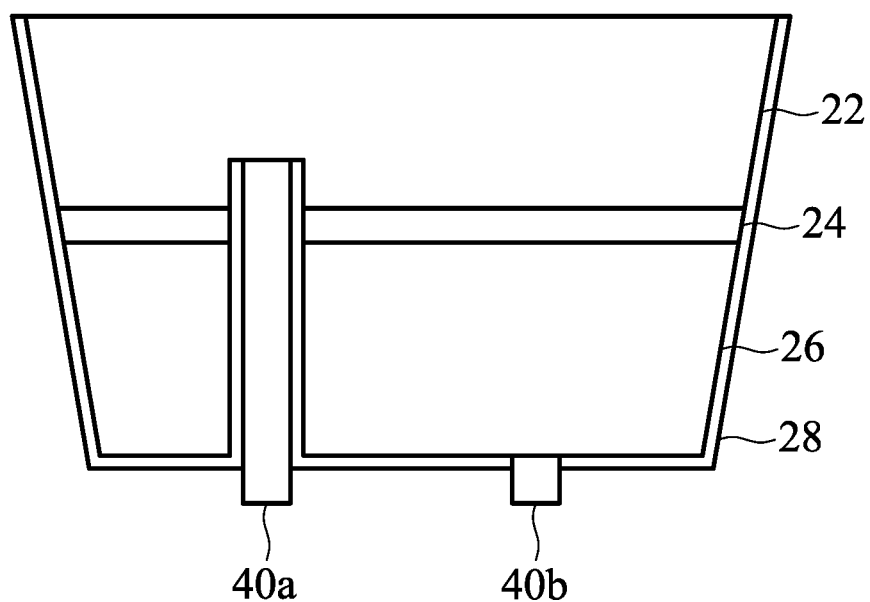
FIG. 5 is a cross-sectional view of the micro semiconductor device in accordance with embodiments of the disclosure.

FIG. 5 is a cross-sectional view of the micro semiconductor device in accordance with embodiments of the disclosure. Herein, the micro semiconductor device 20 includes a first semiconductor layer 22, a light-emitting layer 24, a second semiconductor layer 26, an insulating layer 28, a first electrode 40a, and a second electrode 40b. The first electrode 40a and the second electrode 40b have opposite electrical charges. According to embodiments of the disclosure, the first semiconductor layer 22 can be n-type semiconductor layer and the second semiconductor layer 26 can be p-type semiconductor layer. According to embodiments of the disclosure, the first semiconductor layer 22 can be p-type semiconductor layer and the second semiconductor layer 26 can be n-type semiconductor layer. The light emitting layer 24 and the second semiconductor layer 26 are disposed on the first semiconductor layer 22 sequentially. Namely, the light emitting layer 24 is disposed between the first semiconductor layer 22 and the second semiconductor layer 26. According to embodiments of the disclosure, the first electrode 40a and the second electrode 40b is disposed on the second semiconductor layer 26, and the first electrode 40a can pass through the second semiconductor layer 26 and the light emitting layer 24 and insert into the first semiconductor layer 22. The first electrode 40a electrically connects the first semiconductor layer 22. The insulating layer 28 is disposed between the first electrode 40a and the light emitting layer 24 and disposed between the first electrode 40a and the second semiconductor layer 26, in order to prevent the first electrode 40a from electrically connecting the light emitting layer 24 and the second semiconductor layer 26. In addition, the insulating layer 28 can further extend to the bottom surface of the second semiconductor layer 26 and the surrounding surface of the first semiconductor layer 22, the light emitting layer 24 and the second semiconductor layer 26. According to other embodiments of the disclosure, the micro semiconductor device 20 of the disclosure has tapered sidewalls (i.e. the profile of the micro semiconductor device 20 is an inverted trapezoid which has a greater upper width and a smaller bottom width). FIG. 5 is merely an example of the micro semiconductor device 20 of the disclosure, and is not intended to limit the type of the micro semiconductor device 20. The micro semiconductor device 20 of the disclosure can be any suitable micro semiconductor device. The profile of the micro semiconductor device 20 of the disclosure can also be a positive trapezoid which has a smaller upper width and a greater bottom width, a rectangle, or another suitable shape. The number of the first electrode 40a and the second electrode 40b shown in this embodiment is respectively only one, but the invention is not limited to these embodiments, and there may be a plurality of first electrodes and second electrodes. The accompanying drawings show the micro semiconductor device 20 of the micro semiconductor structure 100 in an inverted trapezoid in order to simplify the illustration.

Figure 6A:
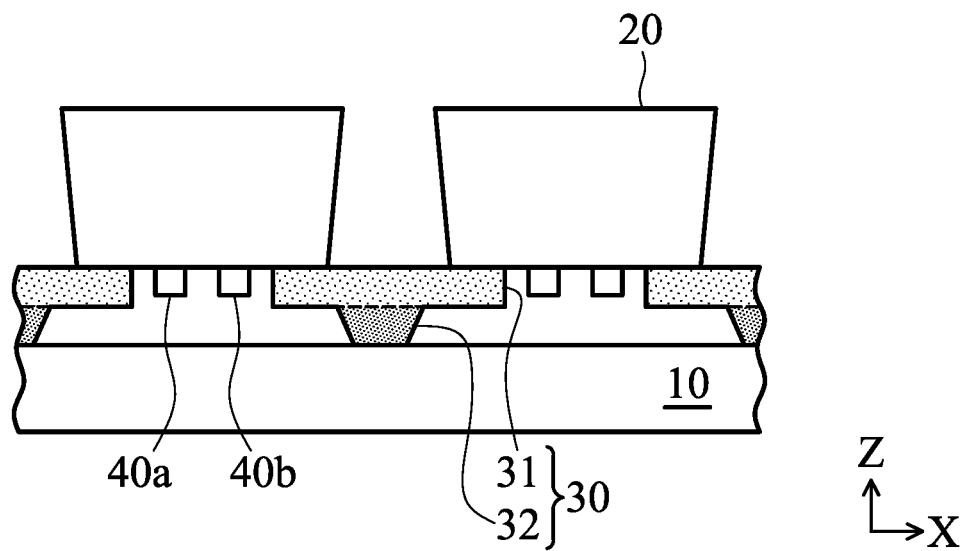
FIGS. 6A-6C are cross-sectional views of the micro semiconductor structures in accordance with embodiments of the disclosure.
Figure 6B:
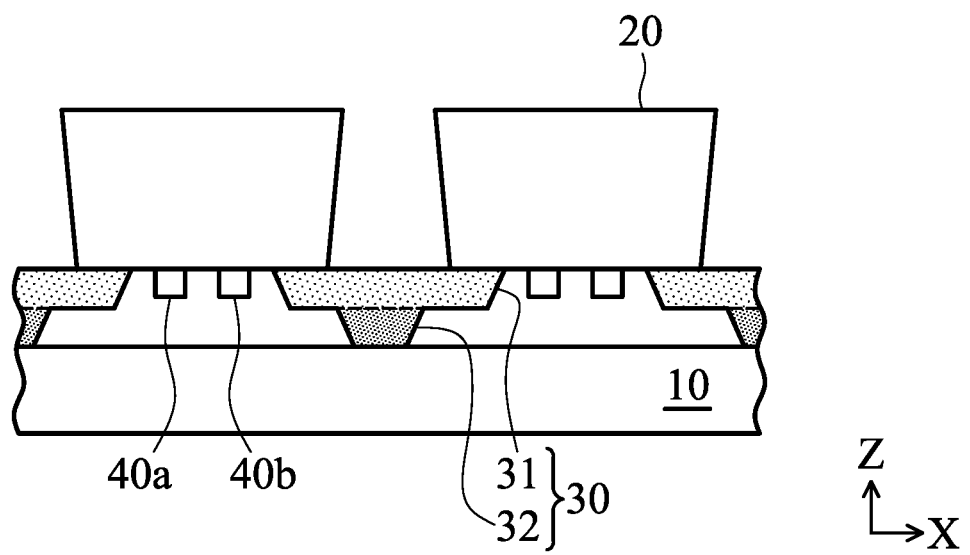
Figure 6C:
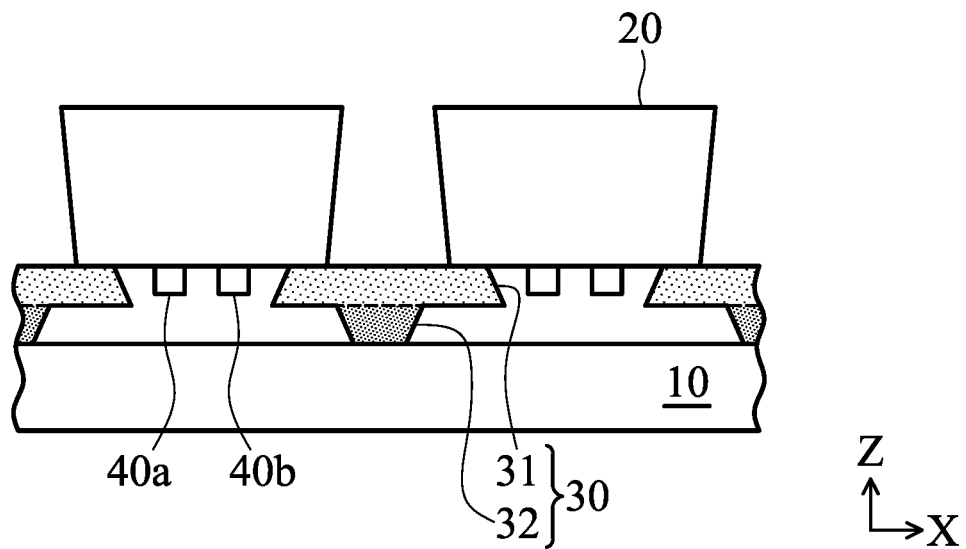

FIG. 6A is a cross-sectional view (in the first direction X) of the micro semiconductor structure in accordance with embodiments of the disclosure. As shown in FIG. 6A, the profile of the bottom portion 32 of the supporting layer 30 can be an inverted trapezoid which has a greater upper width and a smaller bottom width (i.e. the profile of the bottom portion 32 of the supporting layer 30 in the first direction X has tapered sidewalls). As a result, the bottom portion 32, which has a greater upper width and a smaller bottom width, can easily keep the balance of the upper portion 31 of the supporting layer 30, thereby firmly fixing the upper portion 31 of the supporting layer 30 on the bottom portion 32 of the supporting layer 30. In addition, in the subsequent transferring process, the bottom portion 32 of the supporting layer 30, which has a greater upper width and a smaller bottom width, can ensure that the upper portion 31 can be broken, thereby increasing the success rate of the process for picking up and transferring the micro semiconductor device 20. According to some embodiments of the disclosure, the upper portion 31 of the supporting layer 30 can have an inverted trapezoid which has a greater upper width and a smaller bottom width (i.e. the profile of the upper portion 31 of the supporting layer 30 in the first direction X has tapered sidewalls), as shown in FIG. 6B. In addition, according to other embodiments of the disclosure, the upper portion 31 of the supporting layer 30 can have a trapezoidal profile which has a smaller upper width and a greater bottom width, as shown in FIG. 6C.

Figure 7:
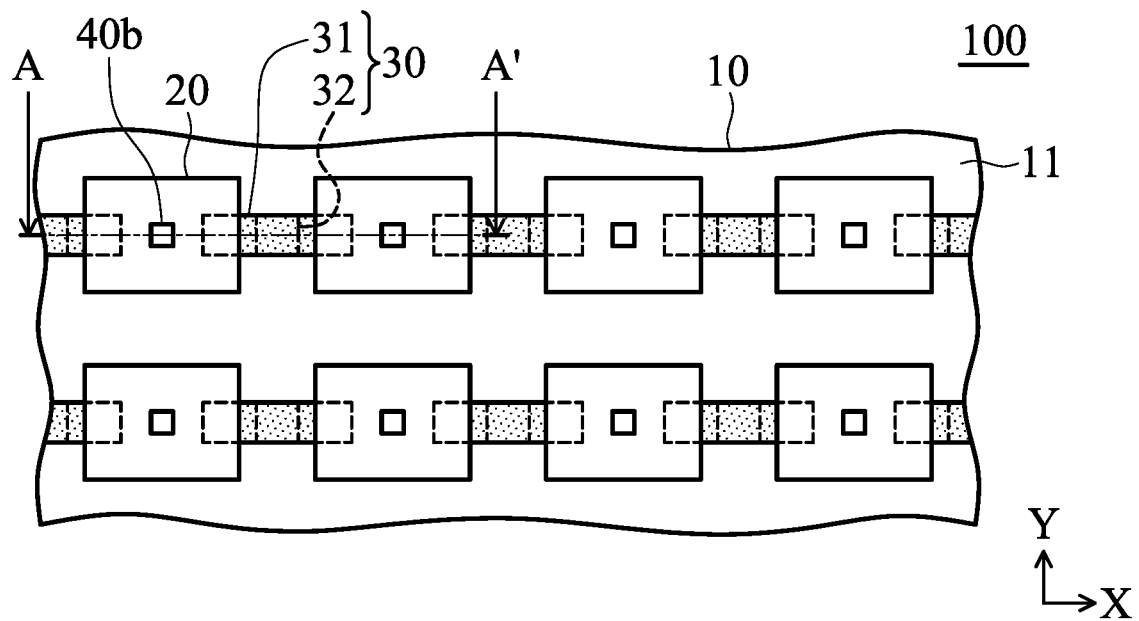
FIG. 7 is a top view of a micro semiconductor structure in accordance with one embodiment of the disclosure.
Figure 8:
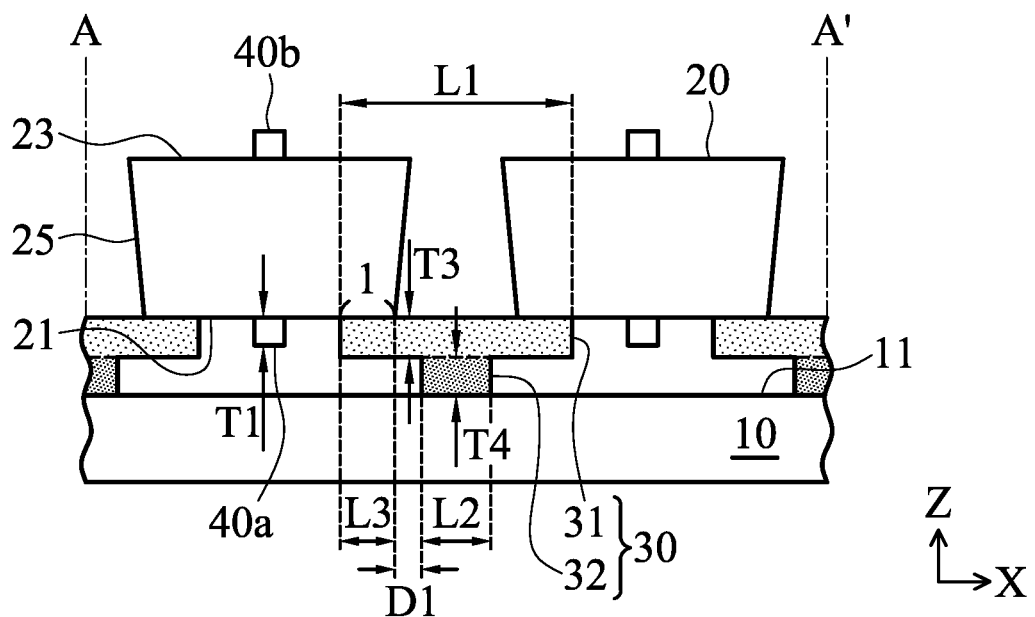
FIG. 8 is a cross-sectional view of the micro semiconductor structure taken along line A-A' of FIG. 7.
Figure 9:
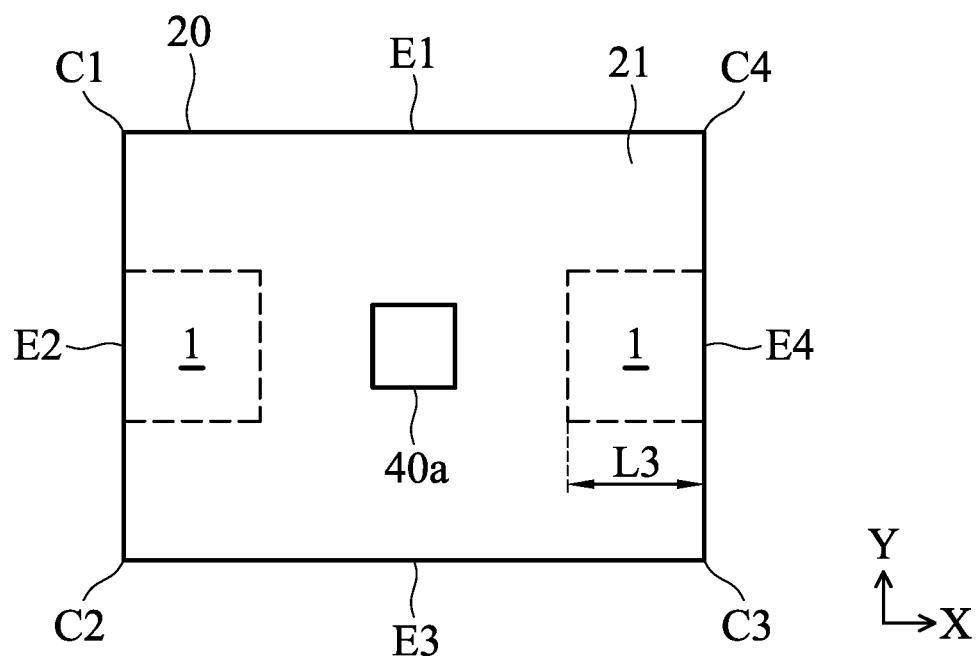
FIG. 9 is a bottom view of any one of the micro semiconductor devices of the micro semiconductor structure of FIG. 7.

FIG. 7 is a top view of a micro semiconductor structure 100 in accordance with another embodiment of the disclosure. FIG. 8 is a cross-sectional view of the micro semiconductor structure 100 taken along line A-A' of FIG. 7, and FIG. 9 is a bottom view of any one of the micro semiconductor devices 20 of the micro semiconductor structure 100 of FIG. 7. The supporting layer 30 and the substrate 10 are not shown in FIG. 9 for convenience of illustration. As shown in FIGS. 8 and 9, the micro semiconductor device 20 can be a perpendicular type micro semiconductor device. Namely, the first electrode 40a of the micro semiconductor device 20 is disposed on the bottom surface 21 of the micro semiconductor device 20, and the second electrode 40b is disposed on the top surface 23 of the micro semiconductor device 20. The first electrode 40a and the second electrode 40b are opposite to each other.

As shown in FIG. 8, the thickness T3 of the upper portion 31 of the supporting layer 30 is less than the thickness T1 of the first electrode 40a. According to embodiments of the disclosure, the sum (i.e. the thickness of the supporting layer 30, T3+T4) of the thickness T3 of the upper portion 31 and the thickness T4 of the bottom portion 32 is greater than the thickness T1 of the first electrode 40a.

As shown in FIG. 9, when only one electrode disposed on the bottom surface 21 of the micro semiconductor device 20, the first region 1 (the area of the bottom surface 21 which is in direct contact with to the upper portion 31) does not contact the first electrode 40a. The ratio (A1/A2) of the surface area A1 of the first region 1 to the surface area A2 of the bottom surface 21 of the micro semiconductor device 20 is greater than or equal to about 0.05 and less than or equal to about 0.5, such as from about 0.05 to 0.5, from about 0.1 to 0.5, from about 0.2 to 0.5, or from about 0.25 to 0.5. When the contact area (i.e. first region) between the upper portion 31 of the supporting layer 30 and the micro semiconductor device 20 is too large, the difficulty of subsequent transferring process would be increased. Furthermore, when the contact area between the upper portion 31 of the supporting layer 30 and the micro semiconductor device 20 is too small, the supporting layer 30 would provide a poor fixing and supporting effect. According to some embodiments of the disclosure, the upper portion 31 of the supporting layer 30 can contact to the first electrode 40a of the perpendicular type micro semiconductor device 20.

Figure 10A:
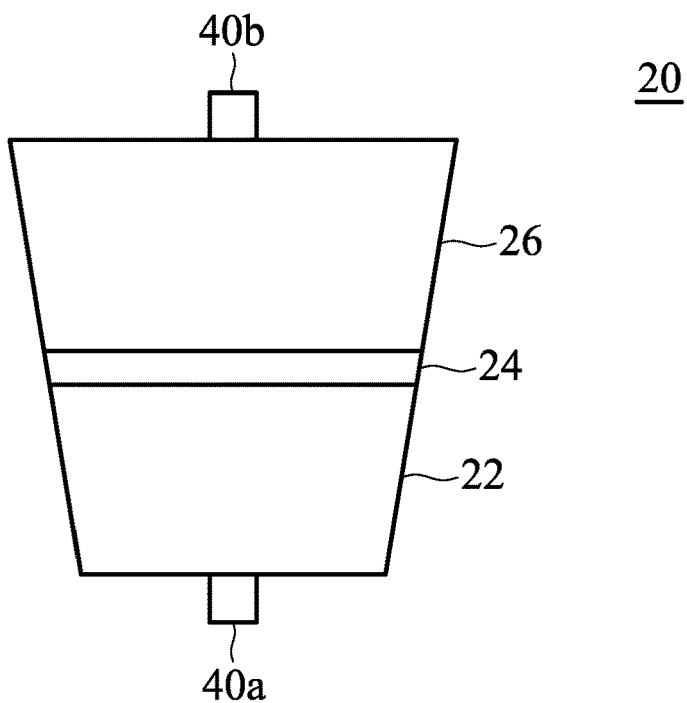
FIGS. 10A and 10B are cross-sectional views of the micro semiconductor device in accordance with embodiments of the disclosure.
Figure 10B:
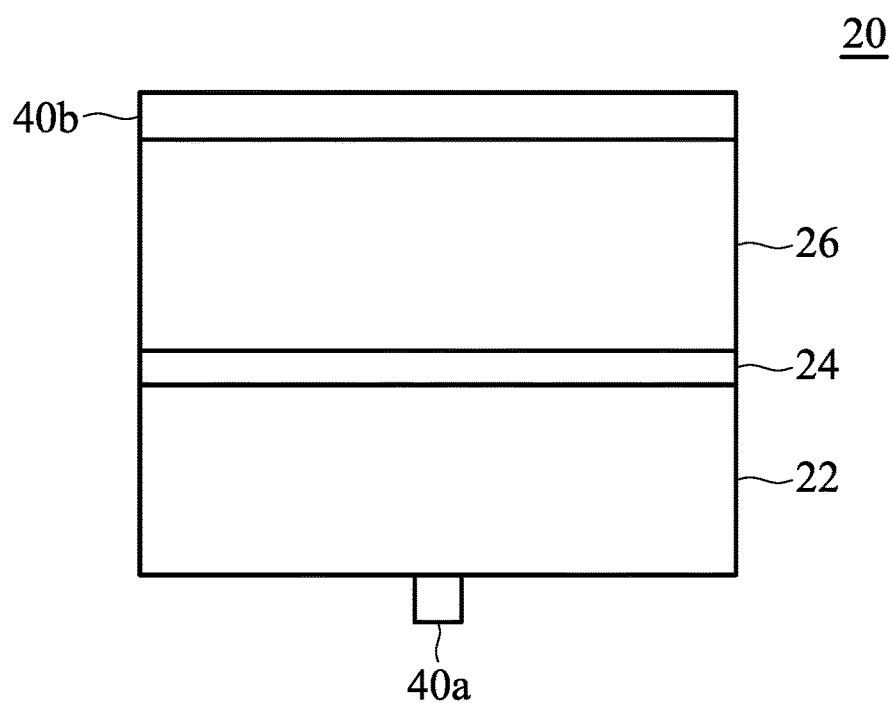

FIG. 10A is a cross-sectional view of the micro semiconductor device 20 of FIG. 8. The micro semiconductor device 20 includes a first semiconductor layer 22, a light emitting layer 24, a second semiconductor layer 26, a first electrode 40a, and a second electrode 40b. The light emitting layer 24 and the second semiconductor layer 26 are disposed on the first semiconductor layer 22 sequentially. Namely, the light emitting layer 24 is disposed between the first semiconductor layer 22 and the second semiconductor layer 26. The first electrode 40a is disposed on the first semiconductor layer 22, and the second electrode 40b is disposed on the second semiconductor layer 26. In addition, the micro semiconductor device 20 can further include an insulating layer (not shown) on the surrounding surface of the first semiconductor layer 22, the second semiconductor layer 26, and/or the light emitting layer 24. According to embodiments of the disclosure, the orthogonal projection of the first electrode 40a onto the substrate 10 can overlap the orthogonal projection of the second electrode 40b onto the substrate 10. According to other embodiments of the disclosure, the surface area of orthogonal projection of the first electrode 40a onto the substrate 10 is greater than or less than the surface area of the orthogonal projection of the second electrode 40b onto the substrate 10. In addition, the second electrode 40b can completely cover the surface of the second semiconductor layer 26, as shown in FIG. 10B. Therefore, the orthogonal projection of the second electrode 40b onto the substrate 10 can overlap the orthogonal projection of the upper portion 31 of the supporting layer 30 onto the substrate 10. When the second electrode 40b keeps away from the upper portion 31 of the supporting layer 30, the electrical connection between the second electrode 40b and the second semiconductor layer 26 can be improved, and the yield of transferring process would not be affected by the second electrode 40b.

Figure 11:
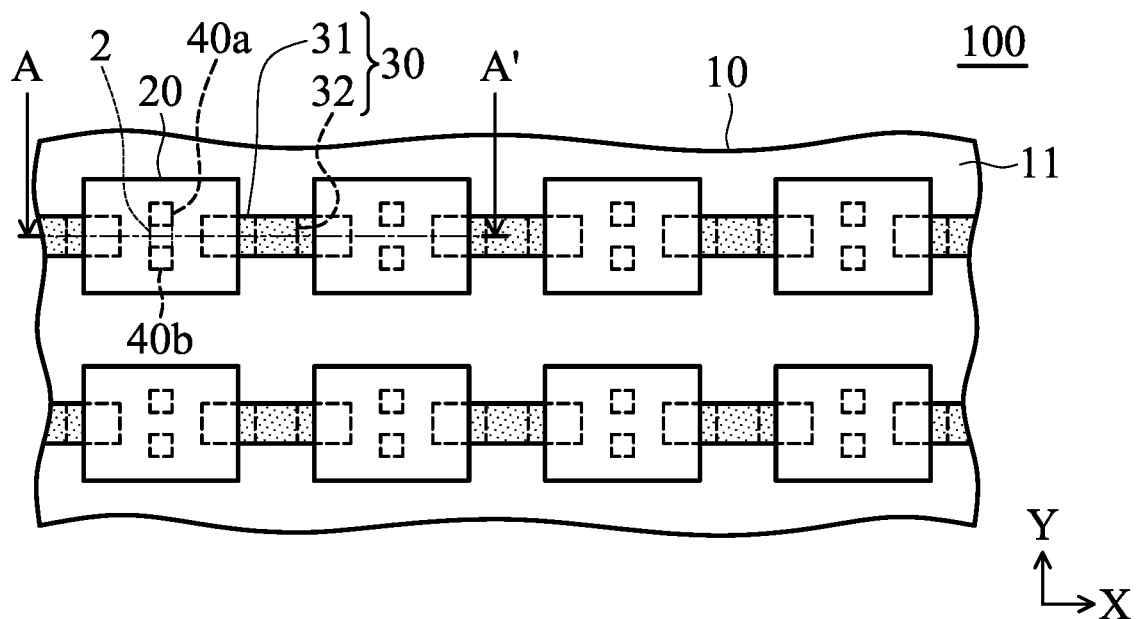
FIG. 11 is a top view of a micro semiconductor structure in accordance with one embodiment of the disclosure.
Figure 12:
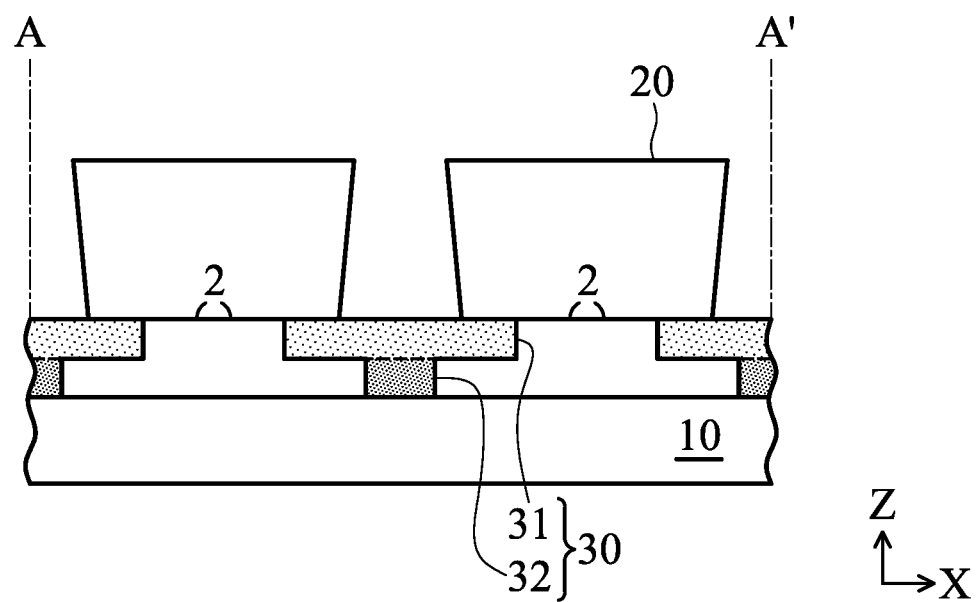
FIG. 12 is a cross-sectional view of the micro semiconductor structure taken along line A-A' of FIG. 11.
Figure 13:
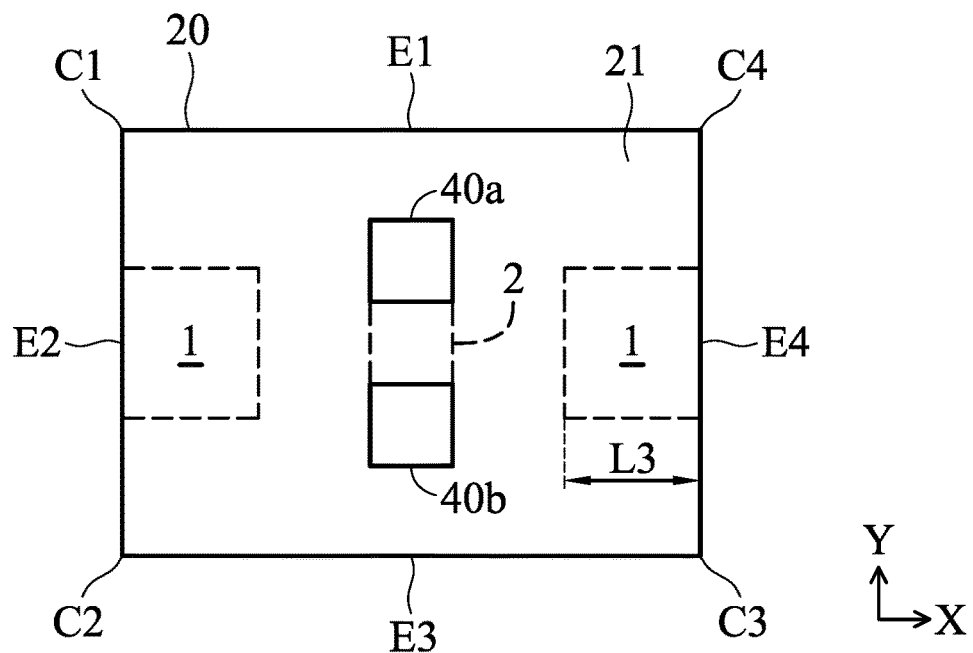
FIG. 13 is a bottom view of any one of the micro semiconductor devices of the micro semiconductor structure of FIG. 11.
Figure 14A:
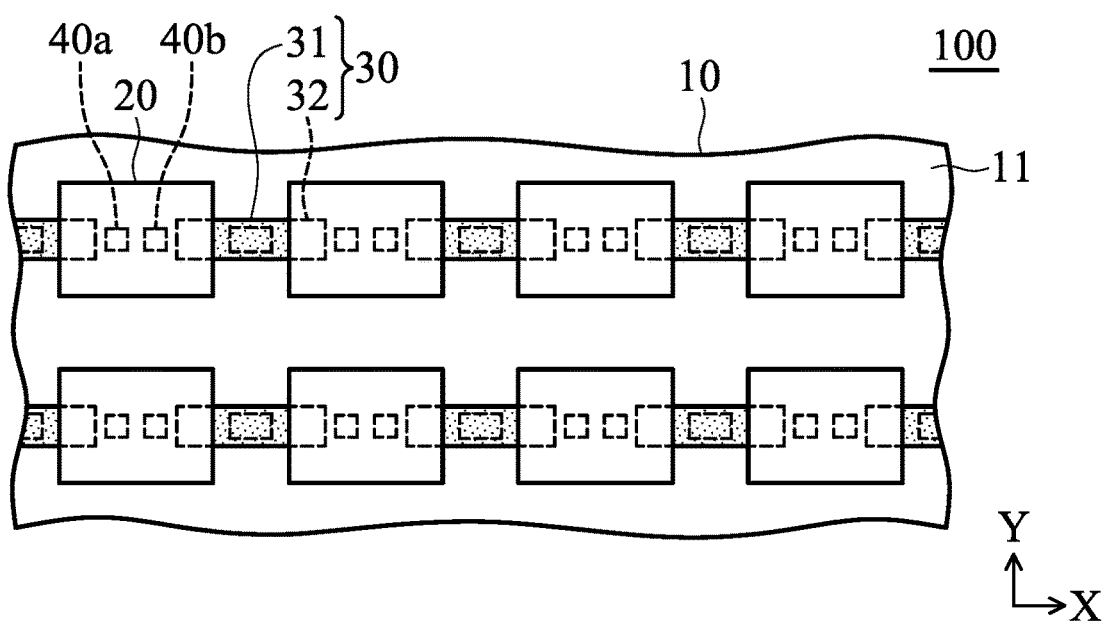
FIGS. 14A-14C are top views of the micro semiconductor structures in accordance with embodiments of the disclosure.
Figure 14B:
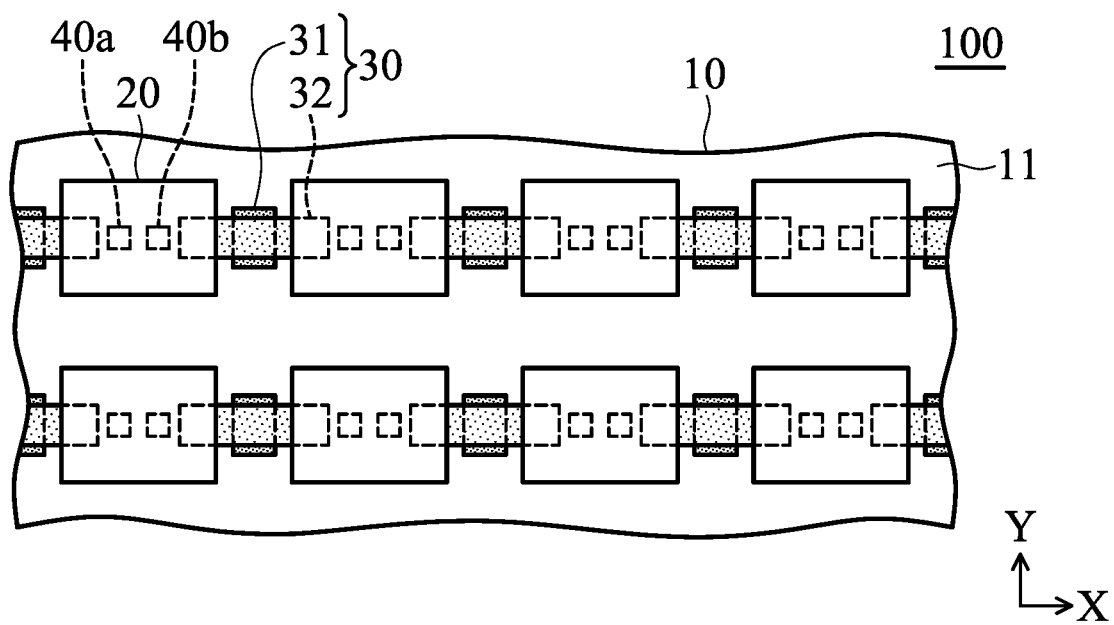
Figure 14C:
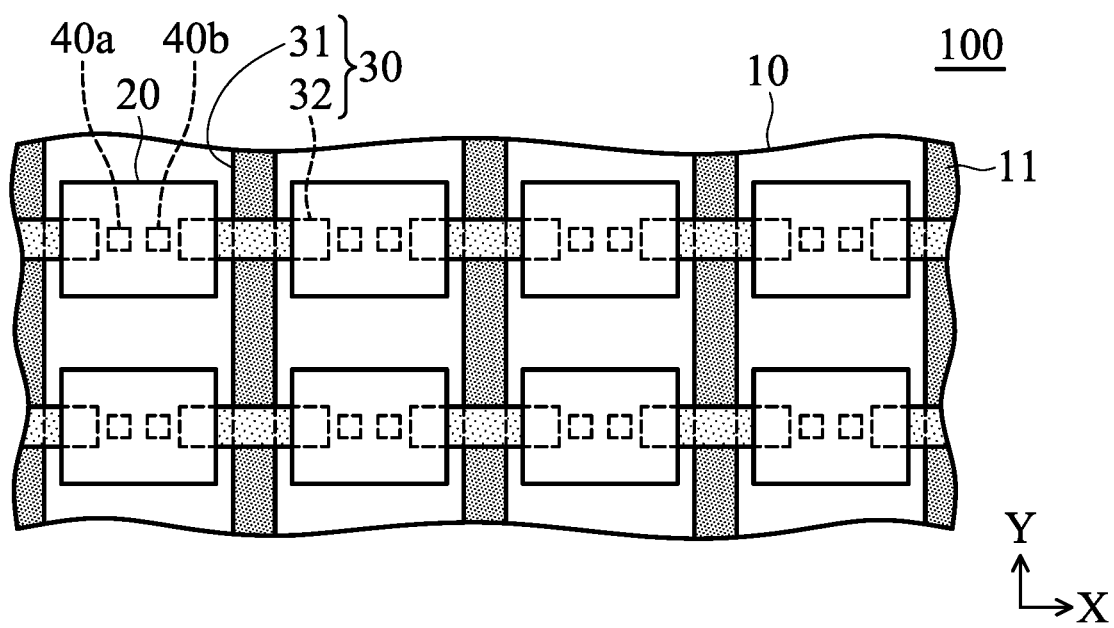

FIG. 11 is a top view of a micro semiconductor structure 100 in accordance with another embodiment of the disclosure. FIG. 12 is a cross-sectional view of the micro semiconductor structure 100 taken along line A-A' of FIG. 11, and FIG. 13 is a bottom view of any one of the micro semiconductor devices 20 of the micro semiconductor structure 100 of FIG. 11. The supporting layer 30 and the substrate 10 are not shown in FIG. 13 for convenience of illustration. As shown in FIG. 11, the first electrode 40a and the second electrode 40b of the micro semiconductor device 20 are disposed on the bottom surface 21 of the micro semiconductor device 20. The upper portion 31 of the supporting layer 30 extends in the first direction X, and the arranging direction of the first electrode 40a and the second electrode 40b of the micro semiconductor device 20 are disposed in a second direction Y, wherein the first direction X is orthogonal to the second direction Y. Since the arranging direction of the first electrode 40a and the second electrode 40b of the micro semiconductor device 20 and the arranging direction of the supporting layer 30 are in an interlaced configuration, there is a relatively large space between the first electrode 40a (or the second electrode 40b) and the supporting layer 30 to avoid contacting each other, thereby increasing the process tolerance. The area of the bottom surface 21 between the first electrode 40a and the second electrode 40b is defined as a second region 2. As shown in FIG. 13, the projection of the second region 2 in the second direction Y completely overlaps a projection of the bottom surface 21 occupied by the first electrode 40a (or the second electrode 40b) in the second direction Y. According to embodiments of the disclosure, the supporting layer 30 does not directly contact with the second region 2. Namely, the first region 1 does not overlap the second region 2. According to embodiments of the disclosure, an orthogonal projection of the bottom portion 32 of the supporting layer 30 onto the substrate 10 overlaps an orthogonal projection of the upper portion 31 of the supporting layer 30 onto the substrate 10, and the width of the bottom portion 32 of the supporting layer 30 in the second direction Y can be equal to the width of the upper portion 31 of the supporting layer 30 in the second direction Y, as shown in FIG. 11. According to some embodiments of the disclosure, the orthogonal projection of the bottom portion 32 of the supporting layer 30 onto the substrate 10 is completely covered by the orthogonal projection of the upper portion 31 of the supporting layer 30 onto the substrate 10, and the width of the bottom portion 32 of the supporting layer 30 in the second direction Y can be less than the width of the upper portion 31 of the supporting layer 30 in the second direction Y, as shown in FIG. 14A. In addition, according to some embodiments of the disclosure, an orthogonal projection of the bottom portion 32 of the supporting layer 30 onto the substrate 10 can partial overlaps an orthogonal projection of the upper portion 31 of the supporting layer 30 onto the substrate 10, and the width of the bottom portion 32 of the supporting layer 30 in the second direction Y is greater than the width of the upper portion 31 of the supporting layer 30 in the second direction Y, as shown in FIG. 14B. FIG. 14C is top view of the micro semiconductor structure 100 in accordance with one embodiment of the disclosure. As shown in FIG. 14C, the bottom portion 32 of the supporting layer 30 can extend in a second direction Y, resulting in there being a plurality of upper portions 31 of the supporting layer 30 disposed on the bottom portion 32 of the supporting layer 30. Namely, the bottom portion 32 of the supporting layer 30 is continuous, and a plurality of discontinuous upper portions 31 of the supporting layer 30 is disposed on the bottom portion 32 of the supporting layer 30. In the embodiment of FIG. 14C, since the arranging direction of the first electrode 40a and the second electrode 40b of the micro semiconductor device 20 and the arranging direction of the supporting layer 30 are in an interlaced configuration and the bottom portion 32 of the supporting layer 30 is continuous, the micro semiconductor device 20 is firmly fixed on the substrate 10 by the supporting layer 30, thereby enhancing the process efficiency and yield.

Figure 15:
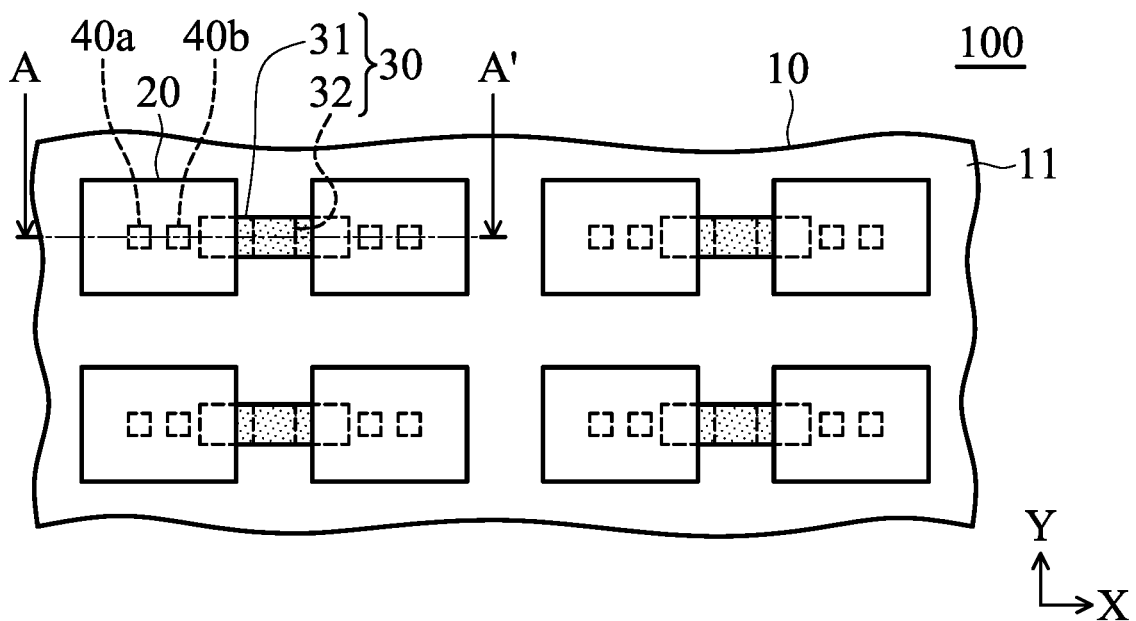
FIG. 15 is a top view of a micro semiconductor structure in accordance with one embodiment of the disclosure.
Figure 16:
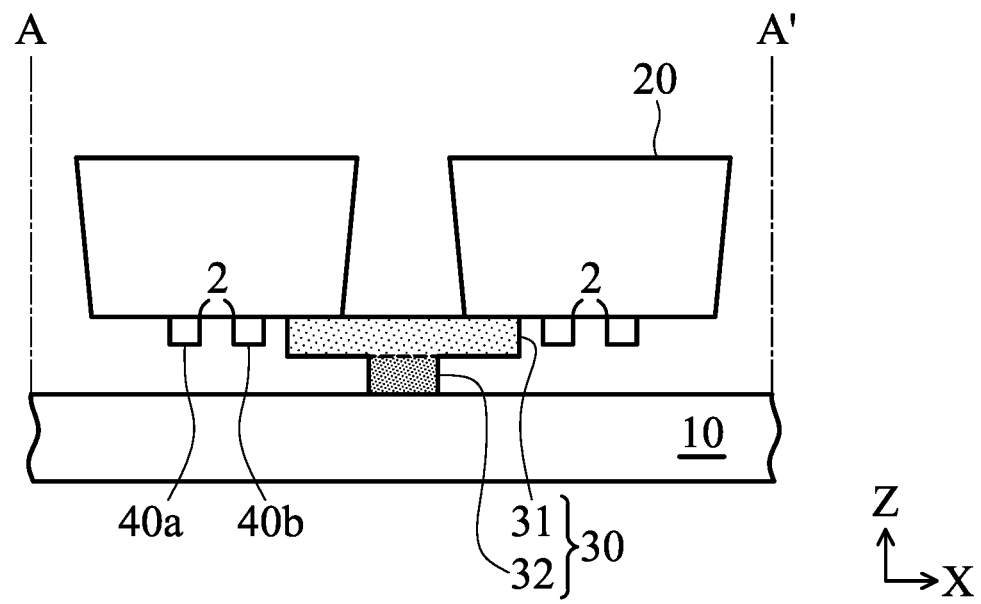
FIG. 16 is a cross-sectional view of the micro semiconductor structure taken along line A-A' of FIG. 15.
Figure 17:
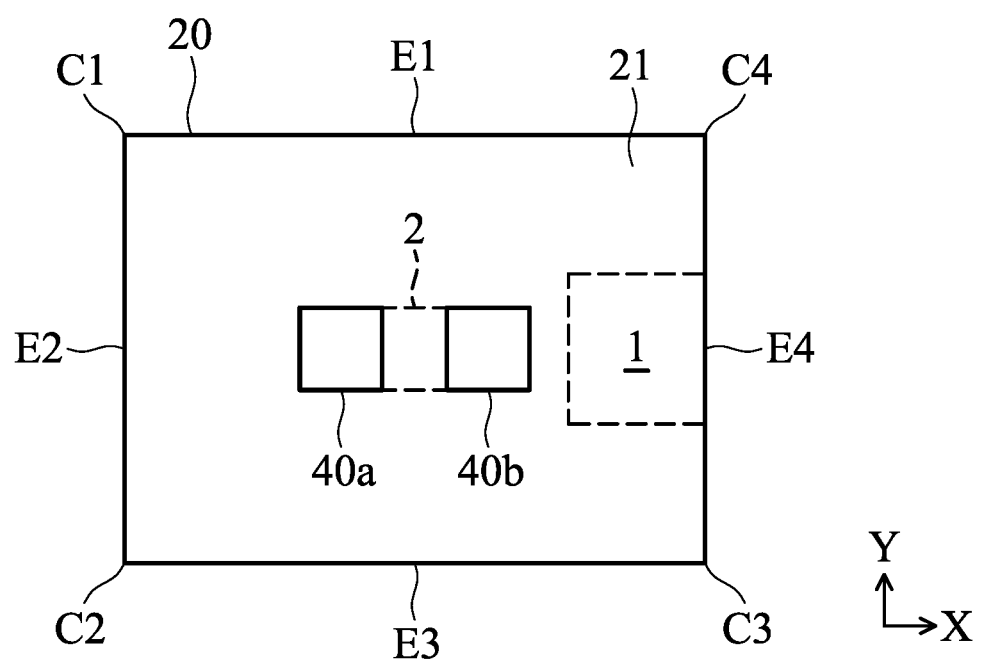
FIG. 17 is a bottom view of any one of the micro semiconductor devices of the micro semiconductor structure of FIG. 15.

FIG. 15 is a top view of a micro semiconductor structure 100 in accordance with another embodiment of the disclosure, FIG. 16 is a cross-sectional view of the micro semiconductor structure 100 taken along line A-A' of FIG. 15, and FIG. 17 is a bottom view of any one of the micro semiconductor devices 20 of the micro semiconductor structure 100 of FIG. 15. The supporting layer 30 and the substrate 10 are not shown in FIG. 17 for convenience of illustration. As shown in FIGS. 15 and 16, the micro semiconductor device 20 merely contacts one upper portion 31 of the supporting layer 30, and the upper portion 31 of the supporting layer 30 is in direct contact with an edge of the bottom surface 21 of the micro semiconductor device 20. There are two adjacent micro semiconductor devices 20 simultaneously disposed on the upper portion 31 of the supporting layer 30, as shown in FIG. 15. The area of the bottom surface 21, which is in direct contact with to the upper portion 31, is defined as the first region 1. As shown in FIG. 17, the bottom surface 21 of the micro semiconductor device 20 has only one first region 1, and the first region is in direct contact with the edge E4 of the bottom surface 21. Since the micro semiconductor device 20 merely contacts one upper portion 31 of the supporting layer 30, the micro semiconductor device 20 can be densely arranged on the substrate, and the supporting layer 30 provides a great fixing and supporting effect. According to some embodiments of the disclosure, the bottom surface 21 of the micro semiconductor device 20 has only one first region 1, and the first region 1 is in direct contact with at least one edge E1, E2 or E3 or at least one of vertex C1, C2, C3 or C4.

Figure 18:
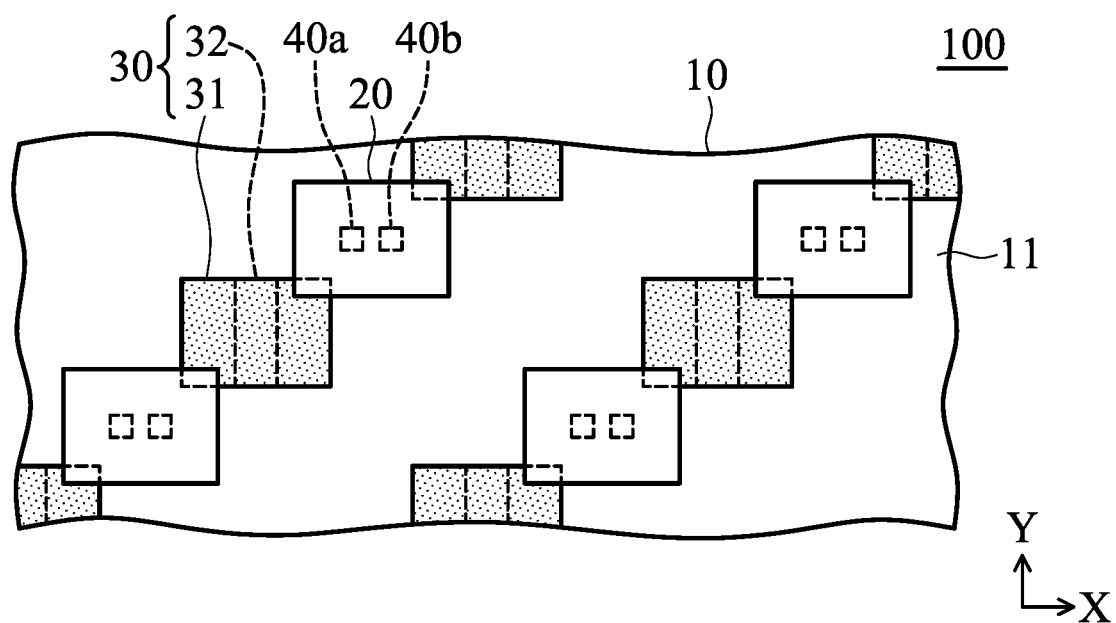
FIG. 18 is a top view of a micro semiconductor structure in accordance with one embodiment of the disclosure.
Figure 19:
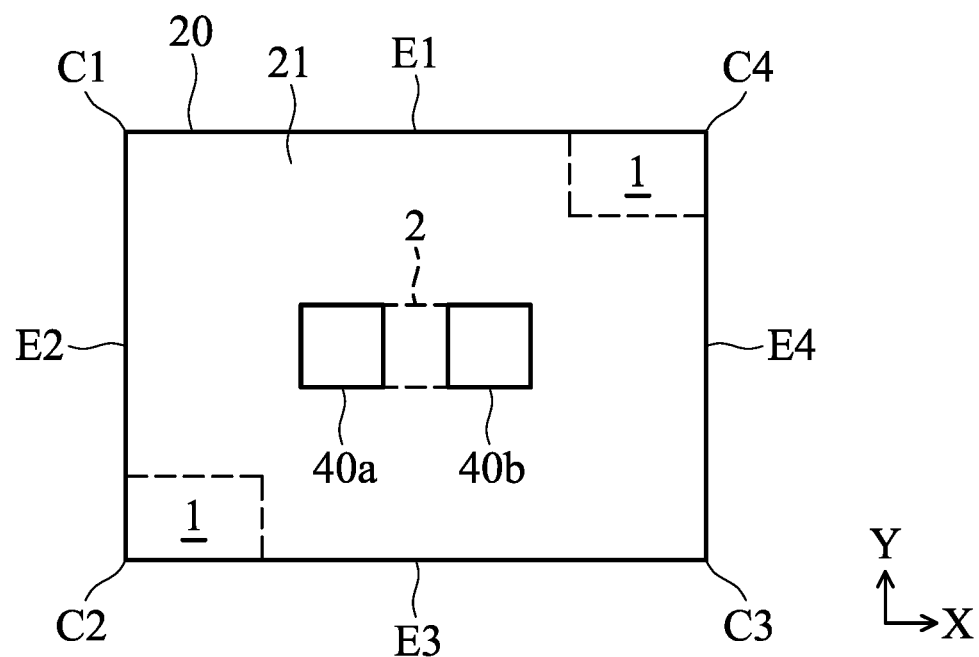
FIG. 19 is a bottom view of any one of the micro semiconductor devices of the micro semiconductor structure of FIG. 18.

FIG. 18 is a top view of a micro semiconductor structure 100 in accordance with another embodiment of the disclosure, and FIG. 19 is a bottom view of any one of the micro semiconductor devices 20 of the micro semiconductor structure 100 of FIG. 18. The supporting layer 30 and the substrate 10 are not shown in FIG. 19 for convenience of illustration. As shown in FIGS. 18 and 19, the micro semiconductor device 20 simultaneously contacts two upper portions 31 of the supporting layer 30, and the two upper portions 31 of the supporting layer 30 cover and directly contact the vertices C2 and C4 of the bottom surface 21 of the micro semiconductor device 20 respectively. Namely, in the top view of the micro semiconductor structure, the two upper portions 31 of the supporting layer 30 locate on a diagonal of the bottom surface 21 of the micro semiconductor device 20. As shown in FIG. 19, the bottom surface 21 of the micro semiconductor device 20 simultaneously has two first regions 1. The two first regions 1 directly contact the vertices C2 and C4 of the bottom surface 21 respectively. According to some embodiments of the disclosure, the micro semiconductor device 20 contacts two upper portions 31 of the supporting layer 30, and the two upper portions 31 of the supporting layer 30 directly contact the vertices C2 and C4 of the bottom surface 21 of the micro semiconductor device 20 respectively. According to other embodiments of the disclosure, the micro semiconductor device 20 simultaneously contacts two upper portion 31 of the supporting layer 30, and the two upper portions 31 of the supporting layer 30 is in direct contact with any two adjacent vertices (such as the vertices C1 and C2, the vertices C2 and C3, the vertices C3 and C4, or the vertices C4 and C1) of the bottom surface 21 of the micro semiconductor device 20.

Figure 20:
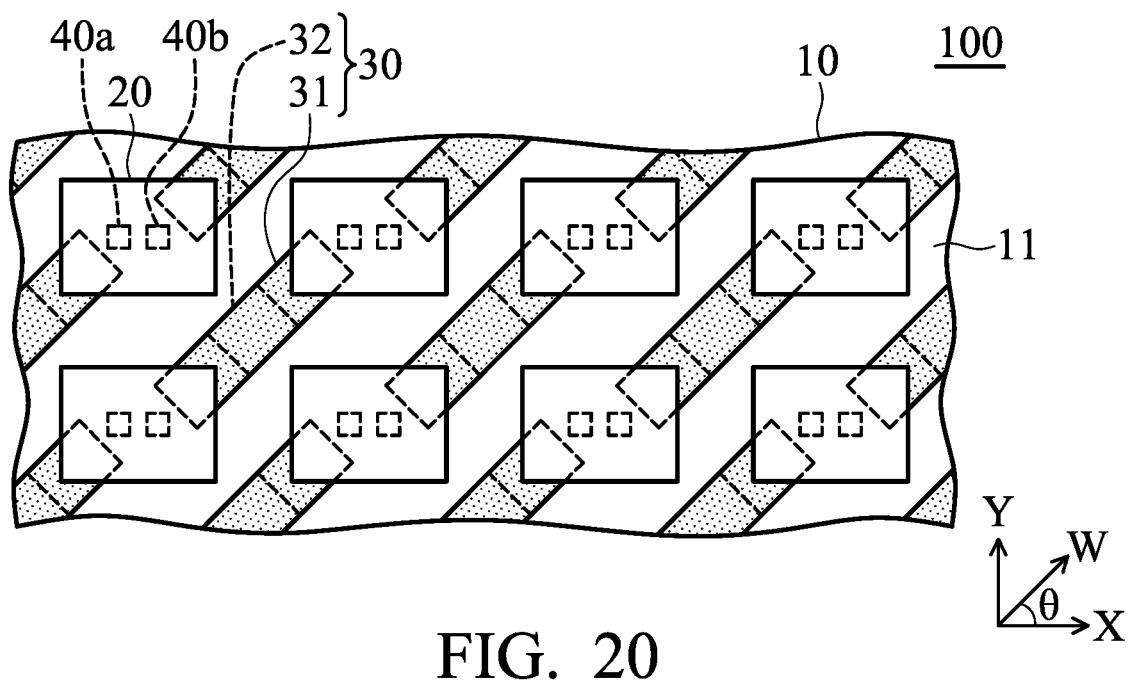
FIG. 20 is a top view of a micro semiconductor structure in accordance with one embodiment of the disclosure.
Figure 21:
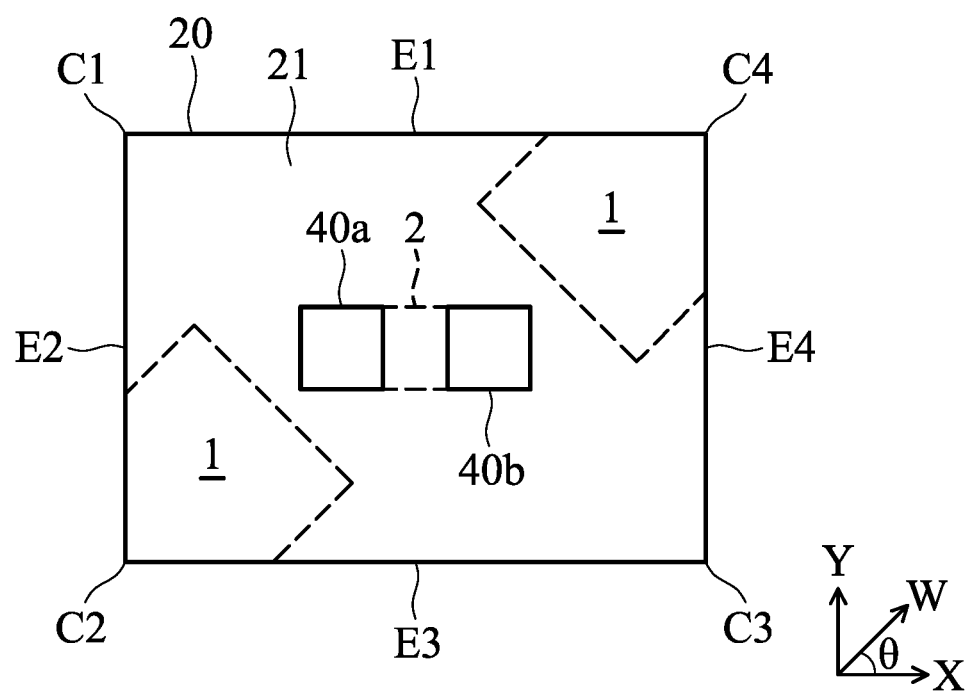
FIG. 21 is a bottom view of any one of the micro semiconductor devices of the micro semiconductor structure of FIG. 20.

FIG. 20 is a top view of a micro semiconductor structure 100 in accordance with another embodiment of the disclosure, and FIG. 21 is a bottom view of any one of the micro semiconductor devices 20 of the micro semiconductor structure 100 of FIG. 20. The supporting layer 30 and the substrate 10 are not shown in FIG. 21 for convenience of illustration. As shown in FIG. 20, the first electrode 40a and the second electrode 40b are disposed on the bottom surface 21 of the micro semiconductor device 20 in the first direction X, and the upper portion 31 of the supporting layer 30 extends in a fourth direction W, wherein the fourth direction W is parallel to the substrate 10. The angle θ defined by the first direction X and the fourth direction W is from about 5 degrees to 85 degrees, such as 30 degrees, 45 degrees, or 60 degrees. As shown in FIGS. 20 and 21, the micro semiconductor device 20 simultaneously contact two upper portions 31 of the supporting layer 30, and the two upper portions 31 of the supporting layer 30 cover and is in direct contact with the vertices C2 and C4 of the bottom surface 21 of the micro semiconductor device 20. Namely, in the top view of the micro semiconductor structure, the two upper portions 31 of the supporting layer 30 locate on a diagonal of the bottom surface 21 of the micro semiconductor device 20. As shown in FIG. 21, the bottom surface 21 of the micro semiconductor device 20 simultaneously has two first regions 1. The two first regions 1 directly contact the vertices C2 and C4 of the bottom surface 21 respectively.

Figure 22:
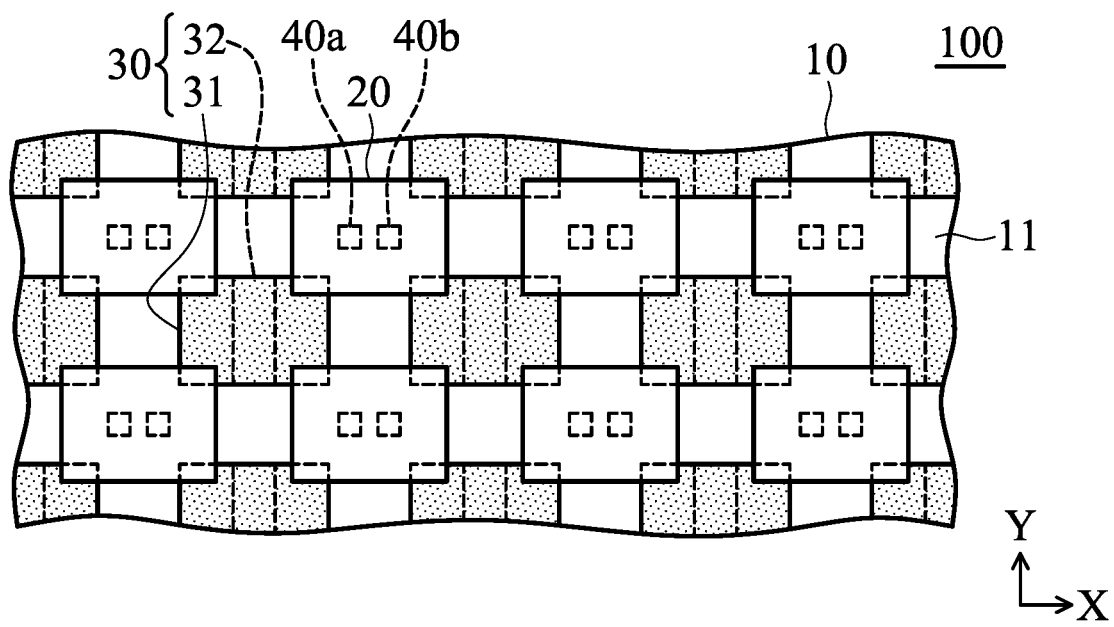
FIG. 22 is a top view of a micro semiconductor structure in accordance with one embodiment of the disclosure.
Figure 23:
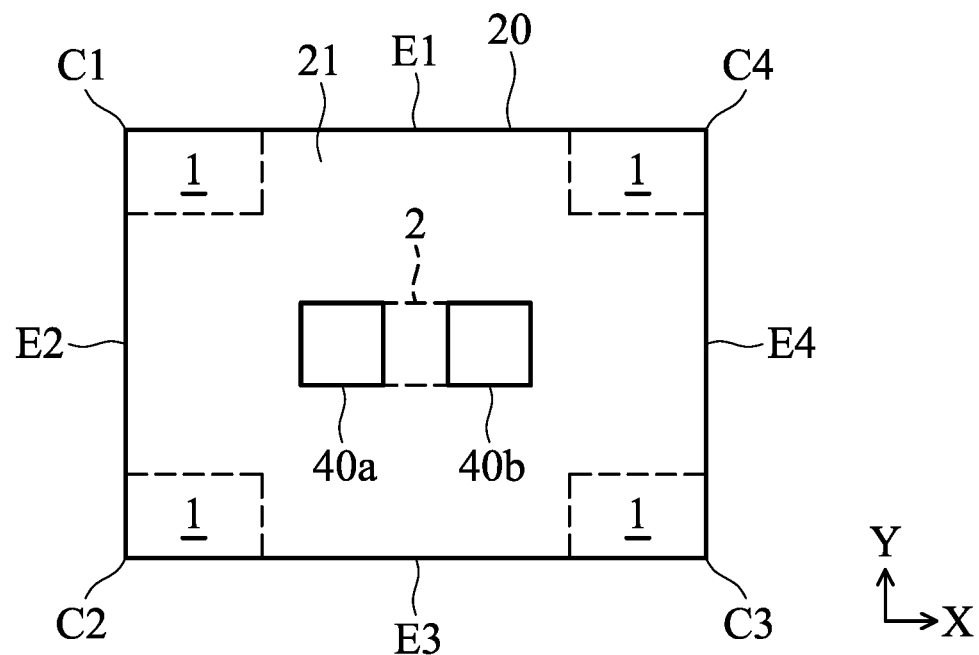
FIG. 23 is a bottom view of any one of the micro semiconductor devices of the micro semiconductor structure of FIG. 22.

FIG. 22 is a top view of a micro semiconductor structure 100 in accordance with another embodiment of the disclosure, and FIG. 23 is a bottom view of any one of the micro semiconductor devices 20 of the micro semiconductor structure 100 of FIG. 22. The supporting layer 30 and the substrate 10 are not shown in FIG. 23 for convenience of illustration. As shown in FIGS. 22 and 23, the micro semiconductor device 20 simultaneously contacts four upper portions 31 of the supporting layer 30, and the four upper portions 31 of the supporting layer 30 cover and directly contact the vertices C1, C2, C3 and C4 of the bottom surface 21 of the micro semiconductor device 20. Namely, in the top view of the micro semiconductor structure, two of the upper portions 31 of the supporting layer 30 locate on one diagonal of the bottom surface 21 of the micro semiconductor device 20, and the other two upper portions 31 of the supporting layer 30 locate on another diagonal of the bottom surface 21 of the micro semiconductor device 20. As shown in FIG. 23, the bottom surface 21 of the micro semiconductor device 20 has four first regions 1, and the four first regions 1 is in direct contact with the vertices C1, C2, C3 and C4 of the bottom surface 21 respectively. Herein, since the four upper portions 31 of the supporting layer 30 contact the vertices C1, C2, C3 and C4 respectively, the weight of the micro semiconductor device 20 is shared by the plurality of the upper portions 31 of the supporting layer 30. Therefore, the micro semiconductor device 20 is held firmly by the supporting layer 30.

Figure 24:
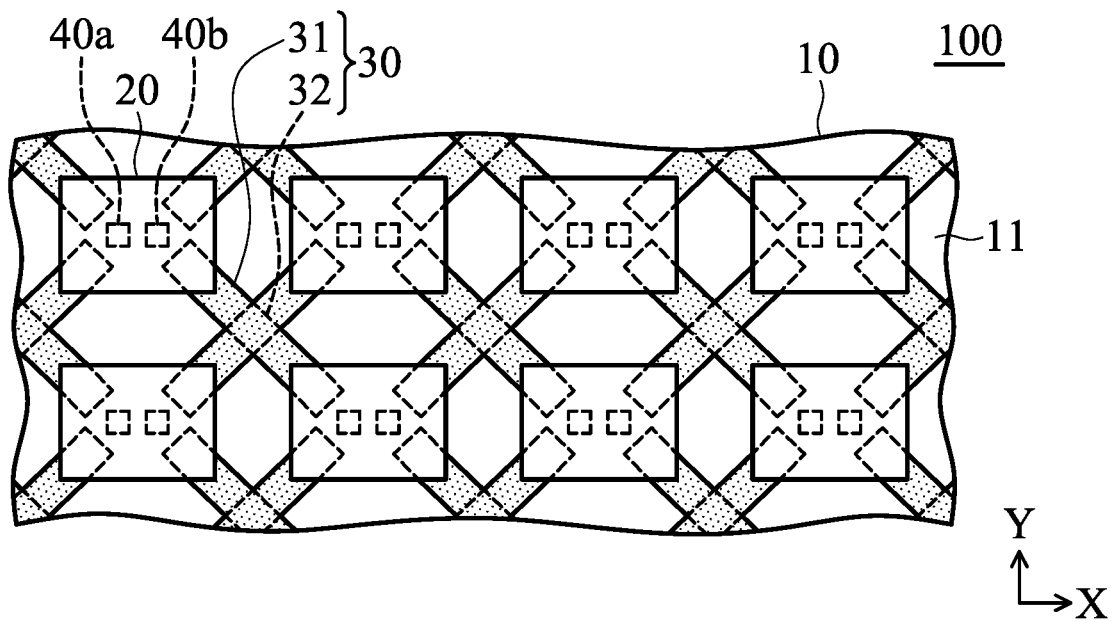
FIG. 24 is a top view of a micro semiconductor structure in accordance with one embodiment of the disclosure.
Figure 25:
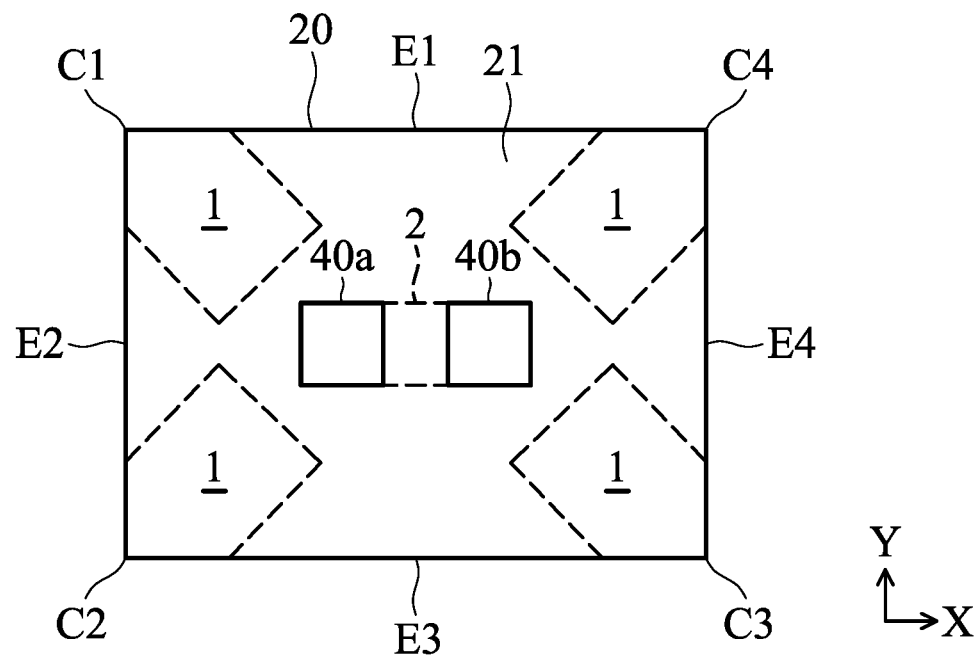
FIG. 25 is a bottom view of any one of the micro semiconductor devices of the micro semiconductor structure of FIG. 24.

FIG. 24 is a top view of a micro semiconductor structure 100 in accordance with another embodiment of the disclosure, and FIG. 25 is a bottom view of any one of the micro semiconductor devices 20 of the micro semiconductor structure 100 of FIG. 24. The supporting layer 30 and the substrate 10 are not shown in FIG. 25 for convenience of illustration. According to embodiments of the disclosure, besides rectangle (as shown in FIG. 22), the orthogonal projection of the upper portion 31 of the supporting layer 30 onto the substrate 10 can be X-shaped configuration. As shown in FIGS. 24 and 25, the micro semiconductor device 20 contacts four upper portion 31 of the supporting layer 30, and the four upper portion 31 of the supporting layer 30 cover and directly contact the vertices C1, C2, C3 and C4 of the bottom surface 21 of the micro semiconductor device 20 respectively. Namely, in the top view of the micro semiconductor structure, two of the upper portions 31 of the supporting layer 30 locate on one diagonal of the bottom surface 21 of the micro semiconductor device 20, and the other two upper portions 31 of the supporting layer 30 locate on another diagonal of the bottom surface 21 of the micro semiconductor device 20. As shown in FIG. 25, the bottom surface 21 of the micro semiconductor device 20 has four first regions 1, and the four first regions 1 is in direct contact with the vertices C1, C2, C3 and C4 of the bottom surface 21 respectively.

Figure 26:
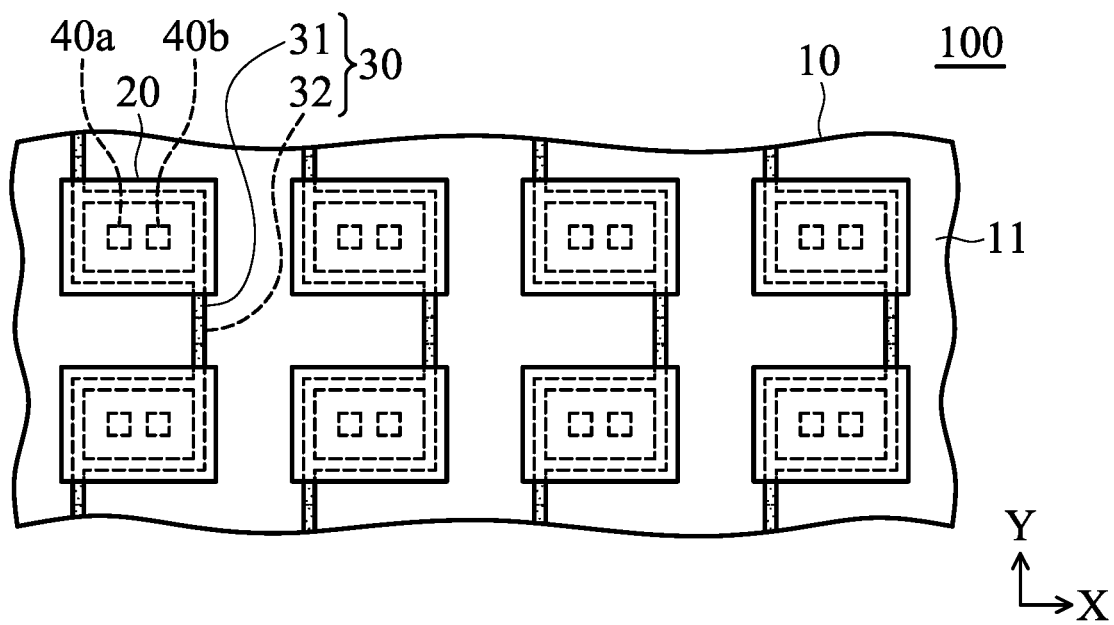
FIG. 26 is a top view of a micro semiconductor structure in accordance with other embodiments of the disclosure.
Figure 27:
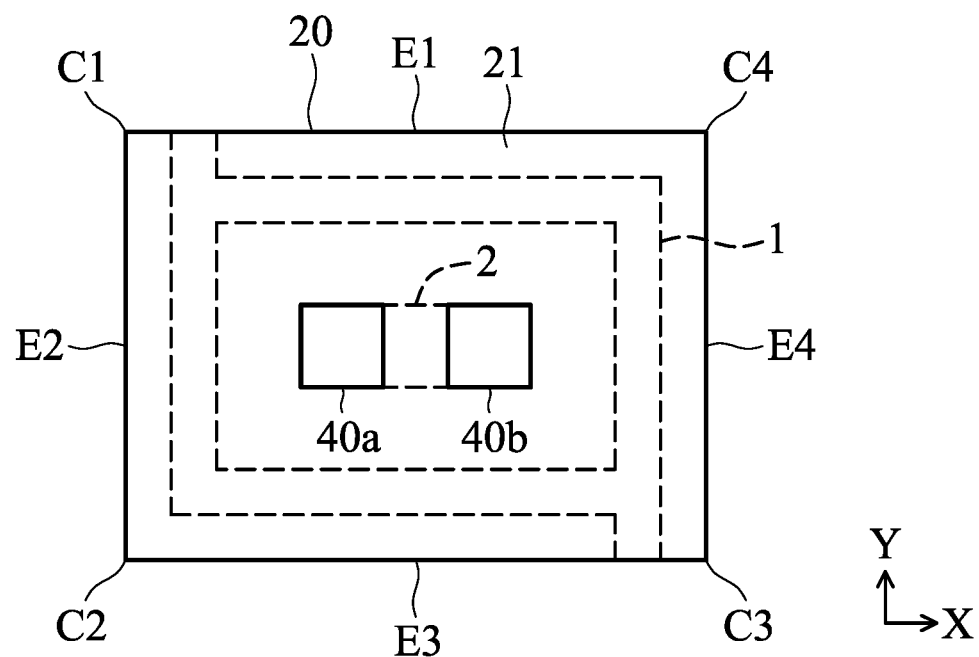
FIG. 27 is a bottom view of any one of the micro semiconductor devices 20 of the micro semiconductor structure of FIG. 26.

FIG. 26 is a top view of a micro semiconductor structure 100 in accordance with other embodiments of the disclosure, and FIG. 27 is a bottom view of any one of the micro semiconductor devices 20 of the micro semiconductor structure 100 of FIG. 26. The supporting layer 30 and the substrate 10 are not shown in FIG. 27 for convenience of illustration. According to embodiments of the disclosure, the upper portion 31 of the supporting layer 30, which is disposed on the bottom surface 21 of the micro semiconductor device 20, can completely surround or encloses the first electrode 40a and the second electrode 40b. The upper portion 31 of the supporting layer 30, which does not contact the bottom surface 21 of the micro semiconductor device 20, can extend in a second direction Y (i.e. the upper portion 31 of the supporting layer 30 extends outward toward the edge E1 and the edge E3 (which is positioned opposite the edge E1)), in order to affix and support the micro semiconductor device 20 effectively. The orthogonal projection of the upper portion 31 of the supporting layer 30 onto the substrate 10 surrounds an enclosed region, and the orthogonal projections of the first electrode 40a and the second electrode 40b of the micro semiconductor device 20 onto the substrate 10 are disposed within the enclosed region. As shown in FIGS. 26 and 27, the first region 1 of the bottom surface 21 of the micro semiconductor device 20 is continuous, and the first region 1 surrounds the second region 2. The upper portion 31 of the supporting layer 30 disposed on the bottom surface 21 of the micro semiconductor device 20 directly contacts the edge E1 and the edge E3.

Figure 28:
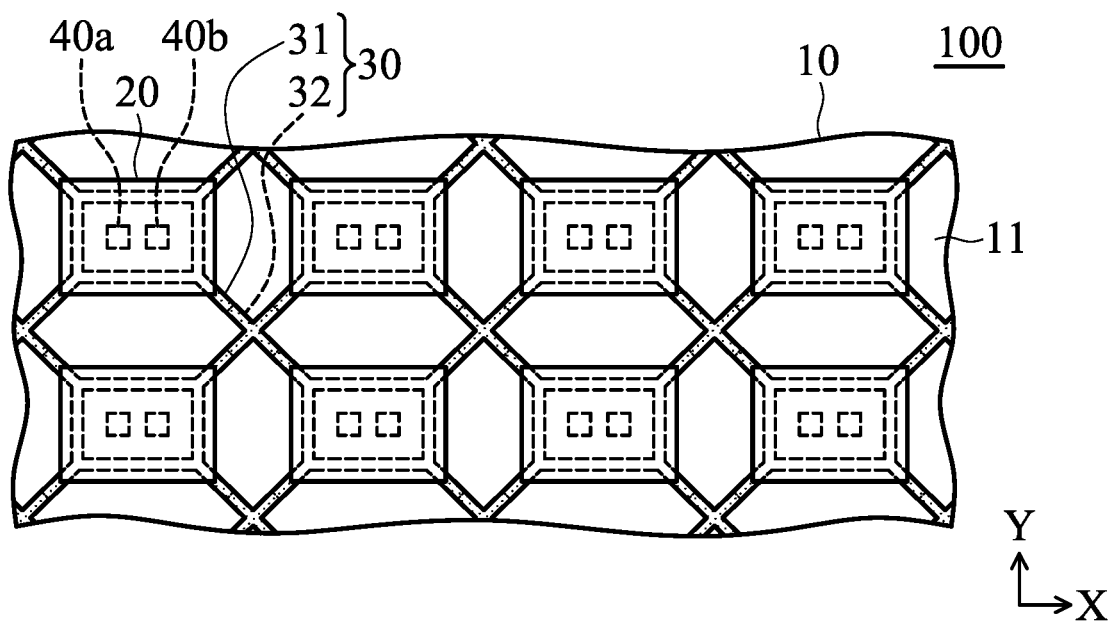
FIG. 28 is a top view of a micro semiconductor structure in accordance with other embodiments of the disclosure.
Figure 29:
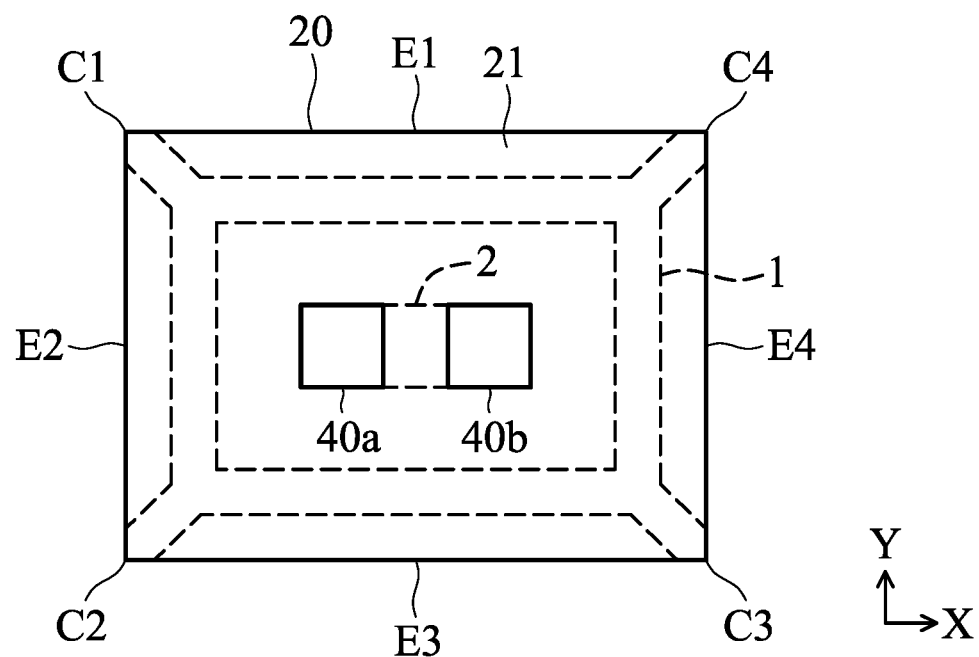
FIG. 29 is a bottom view of any one of the micro semiconductor devices 20 of the micro semiconductor structure of FIG. 28.

FIG. 28 is a top view of a micro semiconductor structure 100 in accordance with other embodiments of the disclosure, and FIG. 29 is a bottom view of any one of the micro semiconductor devices 20 of the micro semiconductor structure 100 of FIG. 28. The supporting layer 30 and the substrate 10 are not shown in FIG. 29 for convenience of illustration. According to embodiments of the disclosure, the upper portion 31 of the supporting layer 30 disposed on the bottom surface 21 of the micro semiconductor device 20 can also surround the first electrode 40a and the second electrode 40b. The upper portion 31 of the supporting layer 30, which does not contact the bottom surface 21 of the micro semiconductor device 20, can extend the diagonal of the bottom surface 21 of the micro semiconductor device 20 (i.e. the straight line connecting the vertices C2 and C4 and/or the straight line connecting the vertices C1 and C3), in order to affix and support the micro semiconductor device 20 effectively. The orthogonal projection of the upper portion 31 of the supporting layer 30 onto the substrate 10 surrounds an enclosed region and the orthogonal projections of the first electrode 40a and the second electrode 40b of the micro semiconductor device 20 onto the substrate 10 are disposed within the enclosed region. As shown in FIGS. 28 and 29, the first region 1 of the bottom surface 21 of the micro semiconductor device 20 is continuous, and the first region 1 surrounds the second region 2. The upper portion 31 of the supporting layer 30 disposed on the bottom surface 21 of the micro semiconductor device 20 directly contacts the vertices C1, C2, C3 and C4.

According to embodiments of the disclosure, the micro semiconductor device 20 can be subsequently transferred, integrated and assembled into a variety of illumination or display applications, such as a micro LED display. The micro LED display can include other components depending on its application. These other components include (but are not limited to) memory, touch panel controllers, and batteries. In other embodiments, the micro LED display can be a television, tablet computer, cell phone, laptop computer, computer monitor, stand-alone terminal server, digital camera, handheld game console, media display, electronics book display, car display or large area electronic board display.

In addition, compared with the general LED technology, the dimension of the micro semiconductor device 20 is reduced from the millimeter level to the micron level, and therefore the micro semiconductor device 20 of the disclosure is transferred, integrated and assembled to obtain a micro LED display. The resulted micro LED display can achieve high resolution and reduce the power consumption of display, and therefore, it has advantages of energy-saving, simple mechanism, thin and so on.

In summary, the micro semiconductor structure of the disclosure has the supporting layer disposed between the substrate and the micro semiconductor device. By means of the supporting layer, the micro semiconductor device can be elevated and held. The micro semiconductor devices are spaced apart from each other by a predetermined distance. As a result, the specific micro semiconductor structure can prevent the micro semiconductor devices from being damaged during the subsequent transferring process. In addition, in the micro semiconductor structure of the disclosure, the supporting layer is disposed on the bottom surface of the micro semiconductor device, rather than sidewalls of the micro semiconductor device. As a result, the amount of the micro semiconductor devices disposed on the temporary carrier can be increased on the premise that the success rate of the process for transporting and transferring the micro semiconductor devices is not reduced.

According to some embodiments of the disclosure, the disclosure provides a micro semiconductor device. The micro semiconductor device of the disclosure has a supporting layer and at least one electrode, and the supporting layer and at least one electrode are disposed on the same surface of an epitaxial structure. Therefore, the overflow extension of the bonding material (i.e. the electrode of the micro semiconductor device and/or the contact pad of the display substrate), which is caused by the heating and pressing in the subsequent bonding process, can be inhibited. As a result, the leakage or short circuit problem can be avoided.

Figure 30:
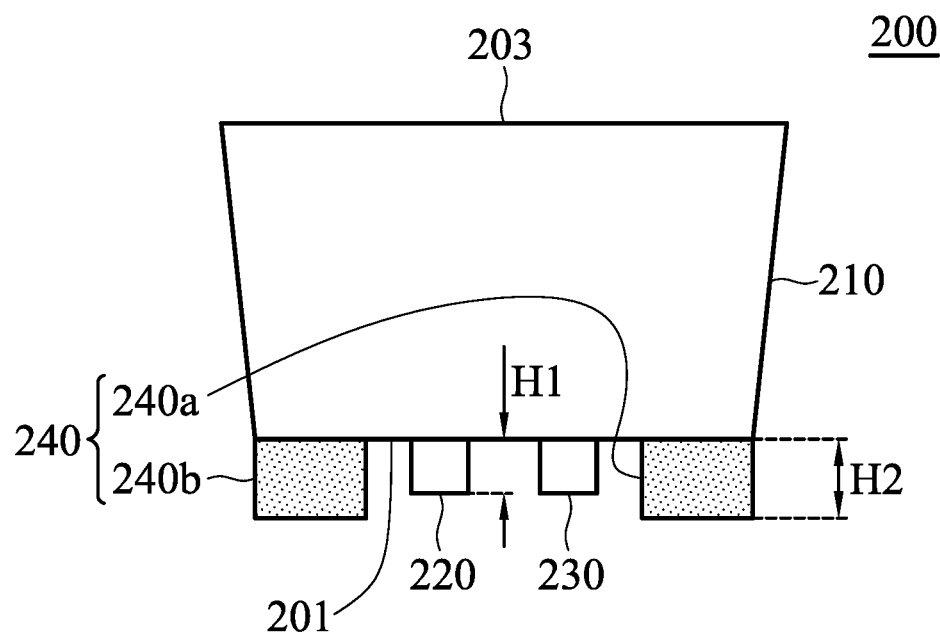
FIG. 30 is a cross-sectional view of the micro semiconductor device in accordance with an embodiment of the disclosure.
Figure 31:
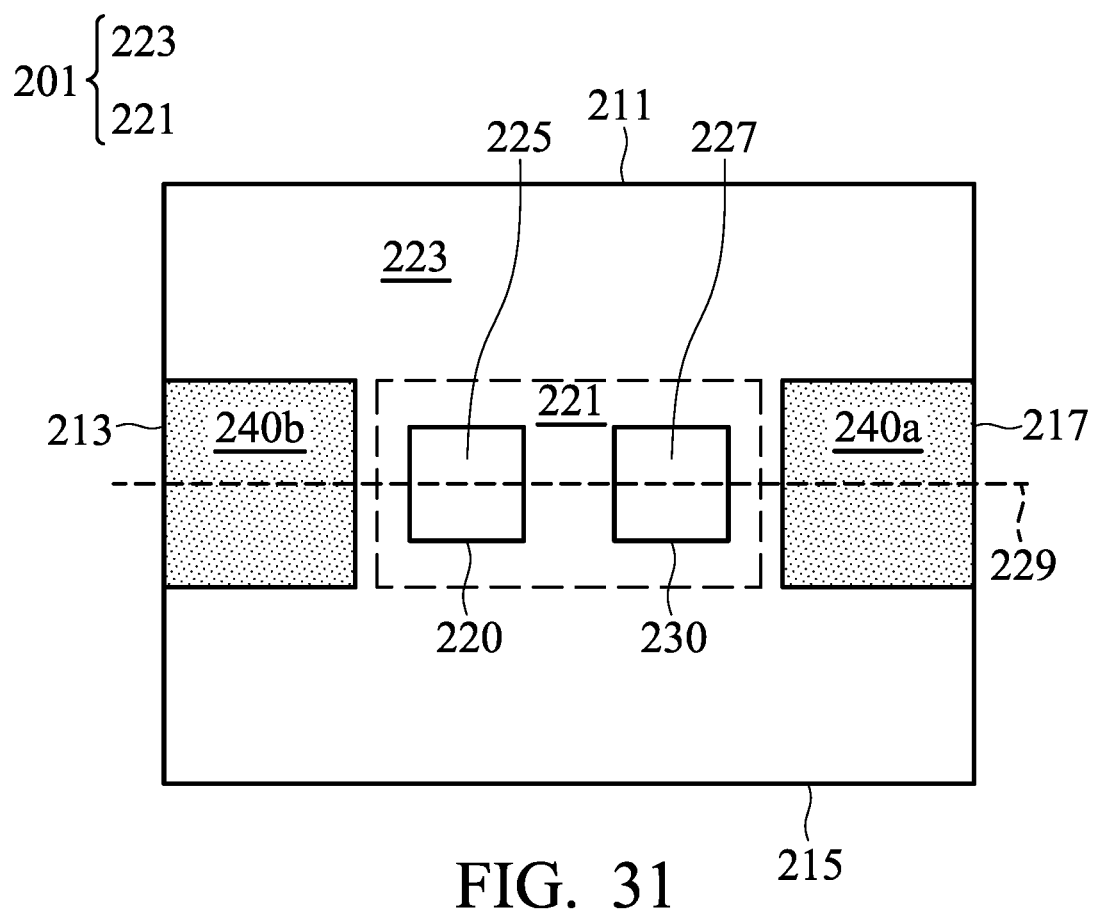
FIG. 31 is a bottom view of the micro semiconductor device of FIG. 30.

According to embodiments of the disclosure, the micro semiconductor device of the disclosure can be prepared by subjecting the micro semiconductor device in the micro semiconductor structure of the disclosure to a transferring process. Namely, after picking up or transferring the micro semiconductor device in the micro semiconductor structure of the disclosure, the micro semiconductor device of the disclosure can be obtained. FIG. 30 is a cross-sectional view of the micro semiconductor device 200 according to an embodiment of the disclosure. The micro semiconductor device 200 as shown in FIG. 30 can be a micro semiconductor device which is obtained by subjecting the micro semiconductor device 20 in the micro semiconductor structure 100 of FIG. 1 to a transferring process. The micro semiconductor device 200 can include an epitaxial structure 210, wherein the epitaxial structure 210 can have a bottom surface 201 and a top surface 203. The micro semiconductor device 200 can include a first electrode 220, second electrode 230, and a supporting layer 240. FIG. 30 is merely an example of the micro semiconductor device 200 of the disclosure, and is not intended to limit the type of the micro semiconductor device 200. The profile of the micro semiconductor device 200 of the disclosure can also be a positive trapezoid which has a smaller upper width and a greater bottom width, a rectangle, or another suitable shape. The accompanying drawings show the micro semiconductor device 200 of the micro semiconductor structure 100 in an inverted trapezoid in order to simplify the illustration. Herein, the supporting layer 240 of the micro semiconductor device 200 can be derived from the upper portion 31 of the supporting layer 30 in the micro semiconductor structure 100 of FIG. 1. In detail, the supporting layer 240 of the micro semiconductor device 200 is the remained upper portion of the supporting layer disposed on the micro semiconductor device after the transferring process. FIG. 31 is a bottom view of the micro semiconductor devices 200 of FIG. 30. The bottom surface 201 of the epitaxial structure 210 of the micro semiconductor device 200 can be defined as a central region 221 and a peripheral region 223, and the peripheral region 223 surrounds the central region 221. The first electrode 220 and the second electrode 230 are disposed on the central region 221, and the supporting layer 240 (including two portions 240a and 240b of the supporting layer) are disposed on the peripheral region 223. According to other embodiments of the disclosure, the supporting layer 240 does not directly contact the first electrode 220 and the second electrode 230, in order to inhibit the overflow extension of the bonding material (i.e. the electrode of the micro semiconductor device and/or the contact pad of the display substrate), which is caused by the heating and pressing in the subsequent bonding process, as shown in FIGS. 30 and 31.

According to embodiments of the disclosure, the supporting aver 240 of the micro semiconductor device 200 is discontinuously arranged on the peripheral region 223. Namely, the supporting layer 240 of the micro semiconductor device 200 can include at least two portions, which are spaced apart from each other. For example, the supporting layer 240 of the micro semiconductor device 200 can include two portions 240a and 240b, which are spaced apart from each other. According to embodiments of the disclosure, the portion 240a can be disposed on the first side of the central region 221 and the portion 240b can be disposed on the second side (which is positioned opposite the first side of the central region 221) of the central region 221, in order to inhibit the overflow extension of the bonding material (i.e. the electrode of the micro semiconductor device and/or the contact pad of the display substrate), which is caused by the heating and pressing in the subsequent bonding process. Namely, the central region 221 is disposed between the portion 240a and the portion 240b. In detail, the bottom surface 201 of the epitaxial structure 210 can have four edges 211, 213, 215 and 217. The edge 211 of the bottom surface 201 is positioned opposite the edge 215 of the bottom surface 201, and the edge 213 of the bottom surface 201 is positioned opposite the edge 217 of the bottom surface 201. Herein, the first portion 240a and the second portion 240b can directly contact two opposite edges (such as the edges 213 and edge 217, or the edges 211 and 215), as shown in FIG. 31. Furthermore, according to other embodiments of the disclosure, an orthogonal projection of the first electrode 220 onto the bottom surface 201 has a first center 225, and an orthogonal projection of the second electrode 230 onto the bottom surface 201 has a second center 227. The orthogonal projection of the supporting layer 240 onto the bottom surface 201 of the epitaxial structure 200 overlap an extension line 229 passing through the first center 225 and the second center 227. As shown in FIG. 31, the orthogonal projection of the first portion 240a onto the bottom surface 201 and the orthogonal projection of the second portion 240b onto the bottom surface 201 simultaneously overlap an extension line 229 passing through the first center 225 and the second center 227. As a result, the supporting layer can further inhibit the overflow extension of the bonding material (i.e. the electrode of the micro semiconductor device and/or the contact pad of the display substrate), which is caused by the heating and pressing in the subsequent bonding process.

Figure 32:
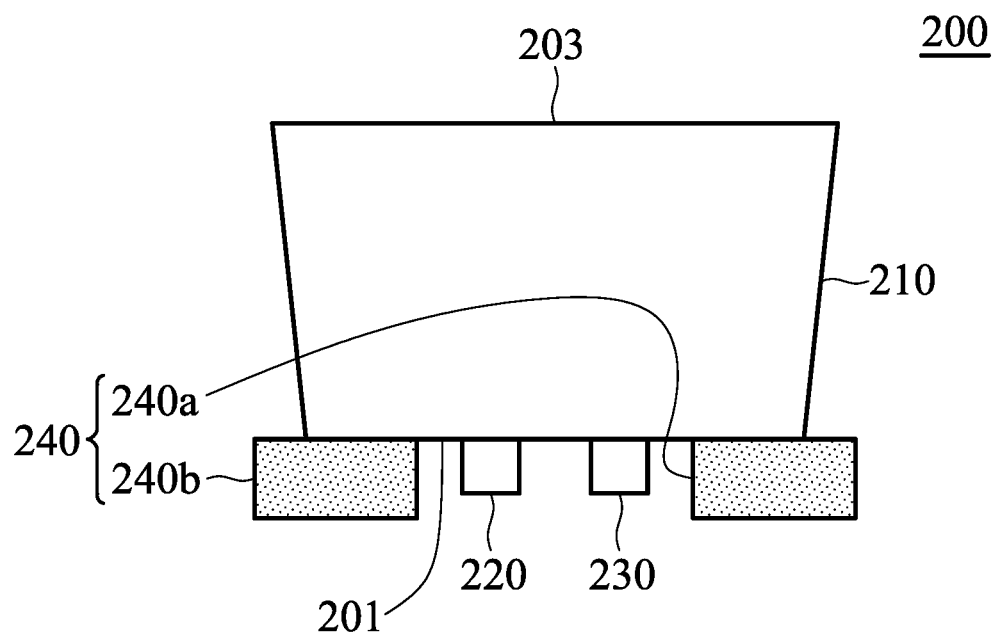
FIG. 32 is a cross-sectional view of the micro semiconductor device in accordance with an embodiment of the disclosure.
Figure 33:
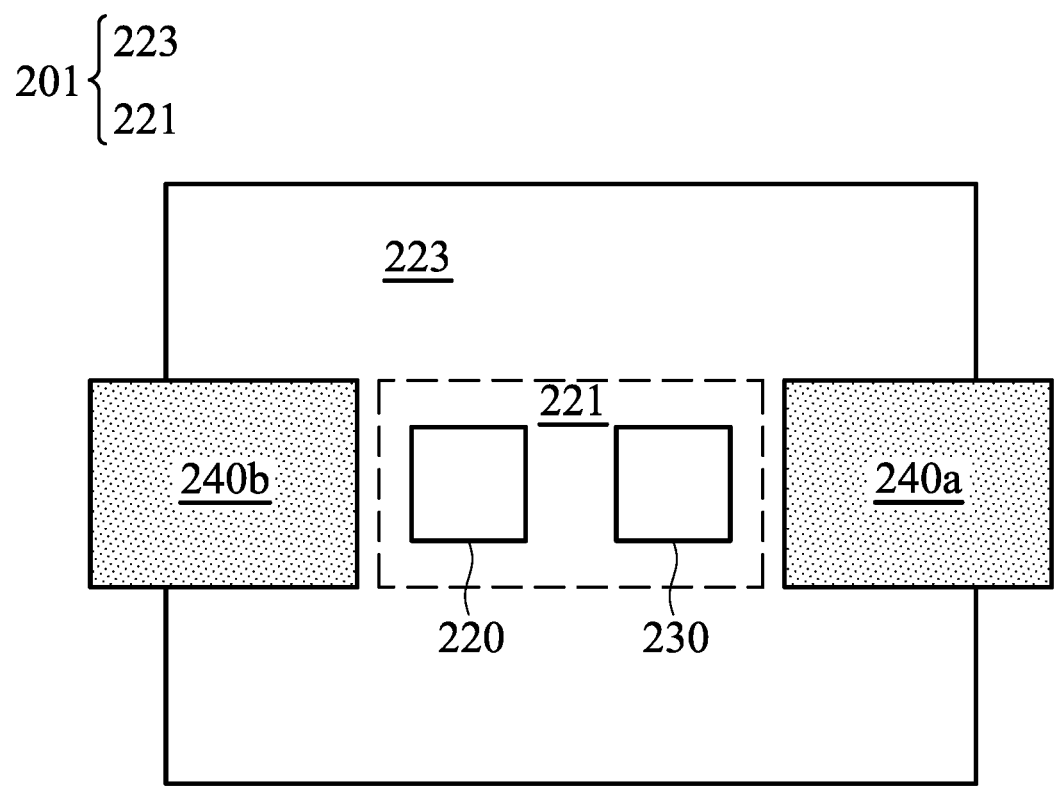
FIG. 33 is a bottom view of the micro semiconductor device of FIG. 32.

According to embodiments of the disclosure, the whole supporting layer 240 of the micro semiconductor device 200 can be disposed on the bottom surface 201 of the epitaxial structure 210 (i.e. the whole orthogonal projection of the supporting layer 240 to a reference plane including the bottom surface 201 is within the bottom surface 201), as shown in FIG. 30. Furthermore, according to embodiments of the disclosure, since the supporting layer 240 of the micro semiconductor device 200 is the remained upper portion 31 of the supporting layer 30 after the transferring process, the supporting layer 240 of the micro semiconductor device 200 can be partially disposed on the bottom surface 201 and protrudes the bottom surface 201 (i.e. a part of the orthogonal projection of the supporting layer 240 onto the reference plane including the bottom surface 201 is not within the bottom surface 201), as shown in FIGS. 32 and 33.

According to embodiments of the disclosure, the first electrode 220 and the second electrode 230 of the micro semiconductor device 200 of the disclosure can have a first height H1, and the supporting layer 240 of the micro semiconductor device 200 can have a second height H2. As shown in FIG. 30, the second height H2 of the supporting layer 240 can be greater than the first height H1 of the first electrode 220 and the second electrode 230. Furthermore, according to embodiments of the disclosure, the second height H2 can be less than or equal to the first height H1. According to embodiments of the disclosure, the ratio (H1/H2) of the first height H1 to the second height H2 can be about 0.8 to 1.2, such as about 0.85, 0.9, 0.95, 1.0, 1.05, 1.1, or 1.15. When the ratio (H1/H2) is about 1, the ability for inhibiting the overflow extension of the bonding material can be enhanced. If the ratio (H1/H2) is too low, the overflow extension degree of the bonding material would be problematic. If the ratio (H1/H2) is too high, the supporting layer 240 is apt to be hanged, thereby reducing the sealability of the supporting layer.

Figure 34:
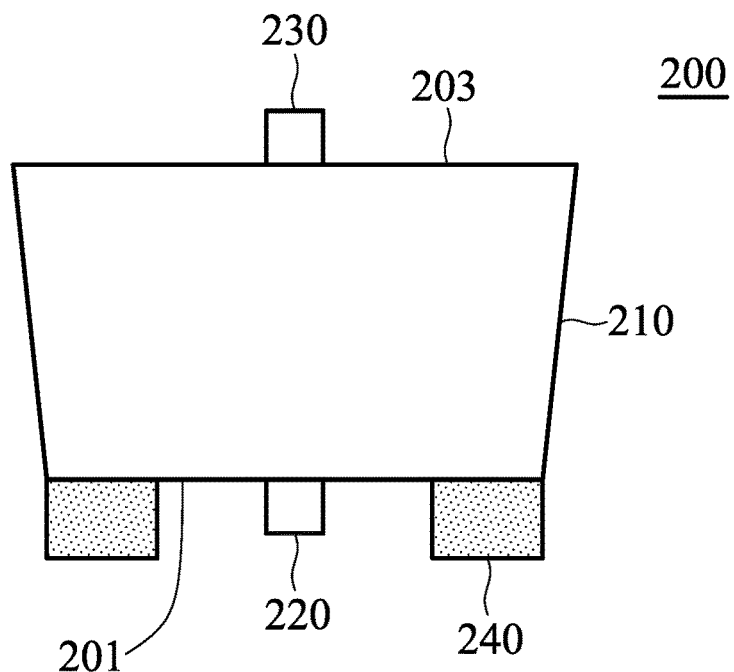
FIG. 34 is a cross-sectional view of the micro semiconductor device according to another embodiment of the disclosure.
Figure 35:
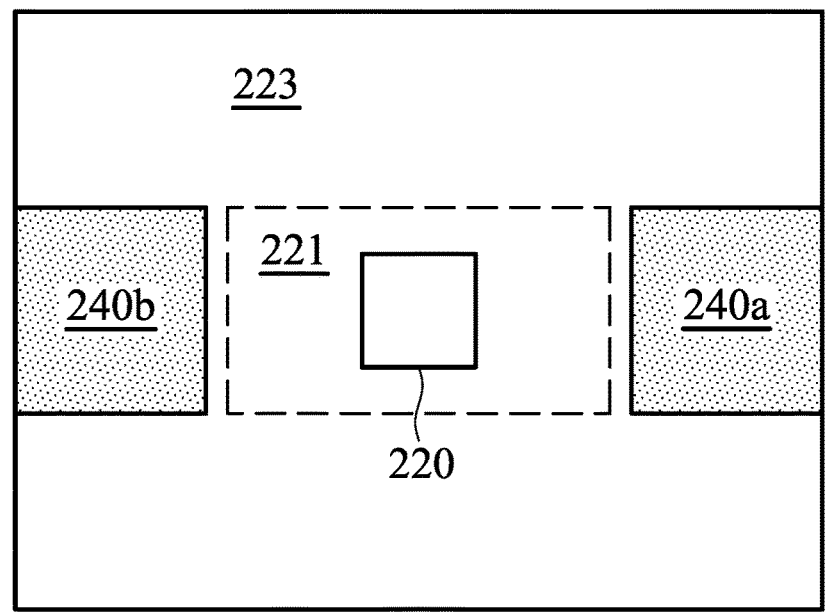
FIG. 35 is a bottom view of the micro semiconductor device of FIG. 34.

FIG. 34 is a cross-sectional view of the micro semiconductor device 200 according to another embodiment of the disclosure. The micro semiconductor device 200 as shown in FIG. 34 can be a micro semiconductor device which is obtained by subjecting the micro semiconductor device 20 in the micro semiconductor structure 100 of FIG. 7 to a transferring process. The micro semiconductor device 200 can be a perpendicular type micro semiconductor device. The first electrode 220 of the micro semiconductor device 200 is disposed on the bottom surface 201, and the second electrode 230 is disposed on the top surface 203. The first electrode 220 and the second electrode 230 are opposite to each other. FIG. 35 is a bottom view of the micro semiconductor devices 200 of FIG. 34. The bottom surface 201 can be defined as of a central region 221 and a peripheral region 223, and the first electrode 220 is disposed on the central region 221. The supporting layer 240 (including two portions 240a and 240b of the supporting layer) is disposed on the peripheral region 223.

Figure 36:
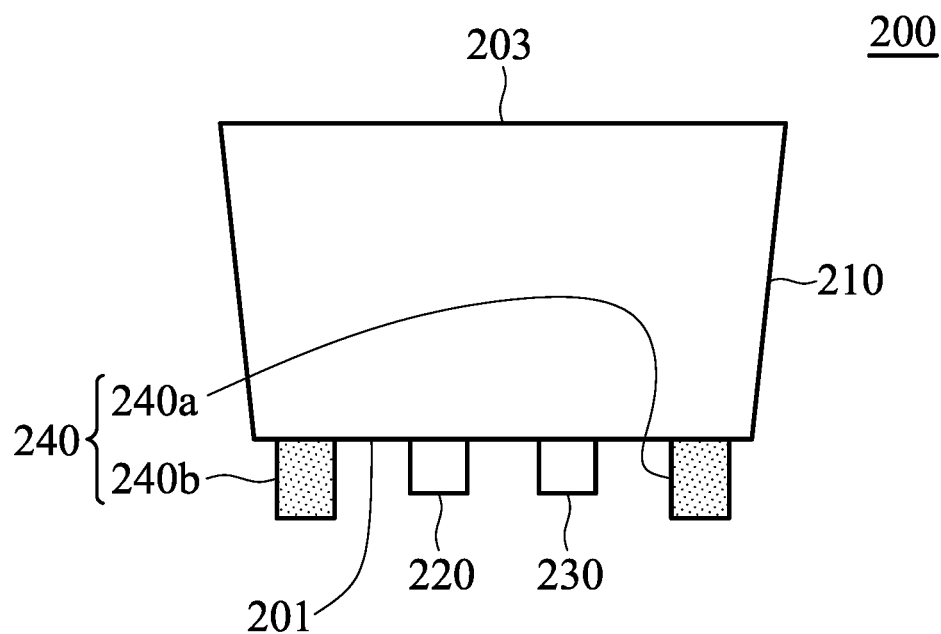
FIG. 36 is a cross-sectional view of the micro semiconductor device in accordance with some embodiments of the disclosure.
Figure 37:
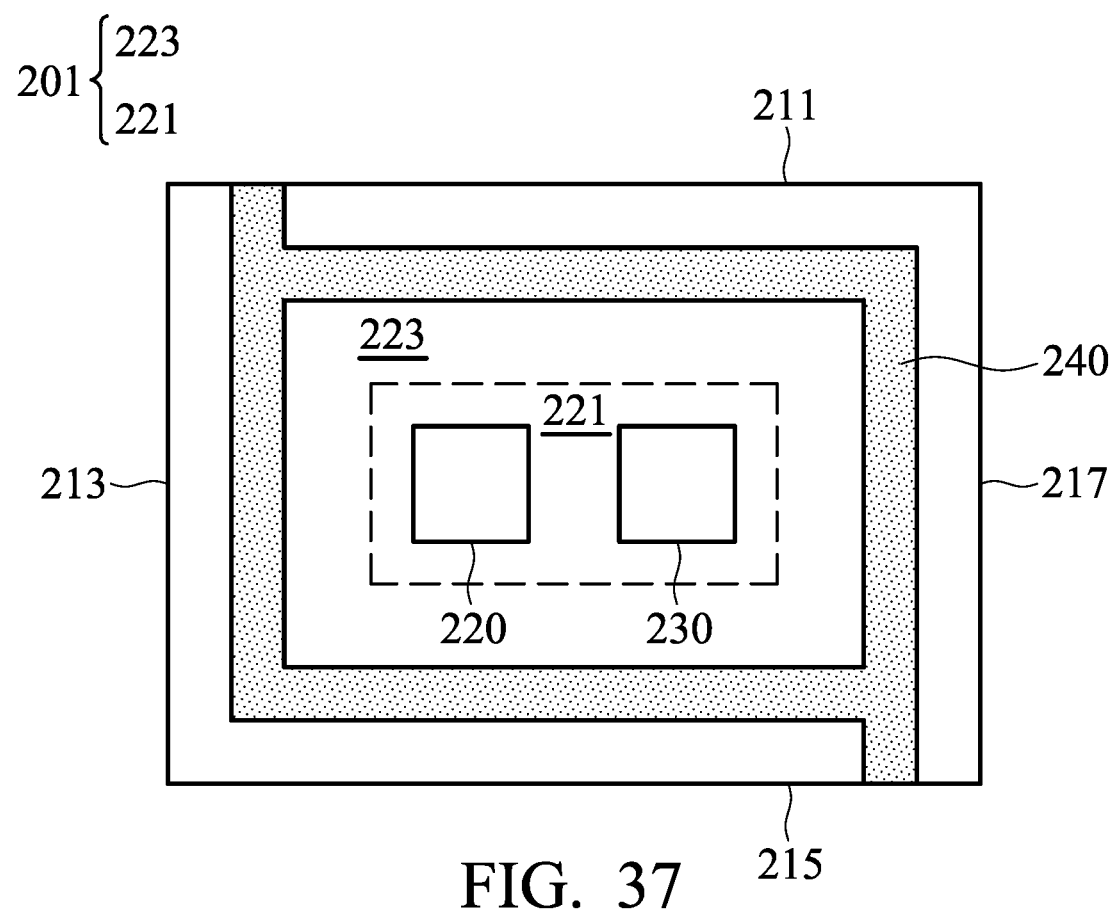
FIG. 37 is a bottom view of the micro semiconductor device of FIG. 36.

FIG. 36 is a cross-sectional view of the micro semiconductor device 200 according to other embodiments of the disclosure. The micro semiconductor device 200 as shown in FIG. 36 can be a micro semiconductor device which is obtained by subjecting the micro semiconductor device 20 in the micro semiconductor structure 100 of FIG. 26 to a transferring process. FIG. 37 is a bottom view of the micro semiconductor devices 200 of FIG. 36. As shown in FIG. 37, the supporting layer 240 can be continuous, the supporting layer 240 disposed on the peripheral region 223 can completely surrounds the central region 221 (i.e. the supporting layer 240 can completely surrounds the first electrode 220 and the second electrode 230). Namely, the orthogonal projection of the supporting layer 240 onto the bottom surface 201 surrounds an enclosed region, and the orthogonal projection of the first electrode 220 onto the bottom surface 201 and the orthogonal projection of the second electrode 230 onto the bottom surface 201 are within the enclosed region. Furthermore, the continuous supporting laver 240 surrounding the central region 221 can directly contact two opposite edges (such as edges 213 and 217, or edges 211 and 215) of the bottom surface 201 simultaneously, as shown in FIG. 37.

Figure 38:
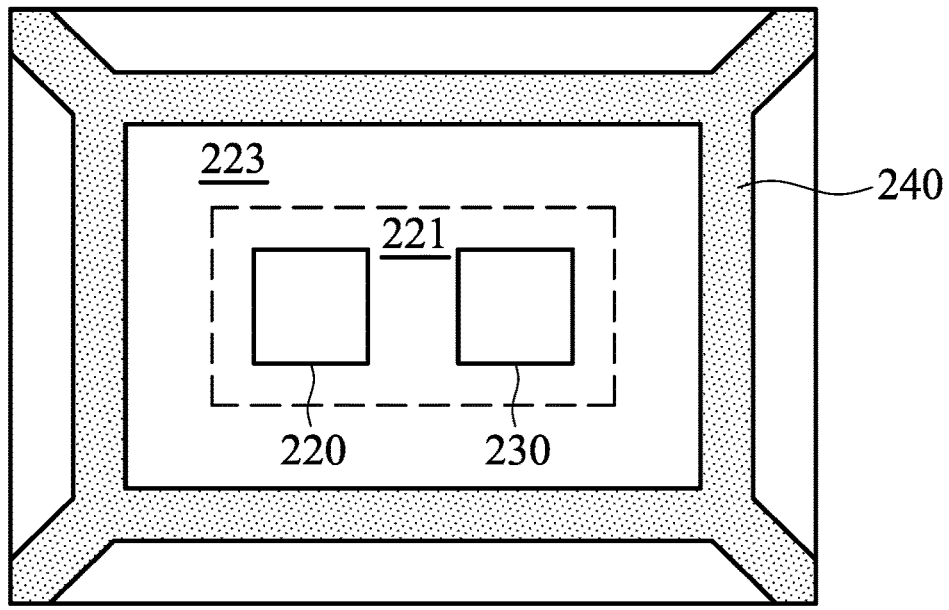
FIG. 38 is a bottom view of the micro semiconductor device in accordance with some embodiments of the disclosure.

FIG. 38 is a cross-sectional view of the micro semiconductor device 200 according to some embodiments of the disclosure. The micro semiconductor device 200 as shown in FIG. 38 can be a micro semiconductor device which is obtained by subjecting the micro semiconductor device 20 in the micro semiconductor structure 100 of FIG. 28 to a transferring process. As shown in FIG. 38, the supporting layer 240 can be continuous, and the supporting layer 240 disposed on the peripheral region 223 can completely surround the central region 221 (i.e. the supporting layer 240 can completely surrounds the first electrode 220 and the second electrode 230). Furthermore, the continuous supporting layer 240 surrounding the central region 221 can directly contact the four edges 211, 213, 215 and 217 of the bottom surface 201 simultaneously, as shown in FIG. 38.

Figure 39:
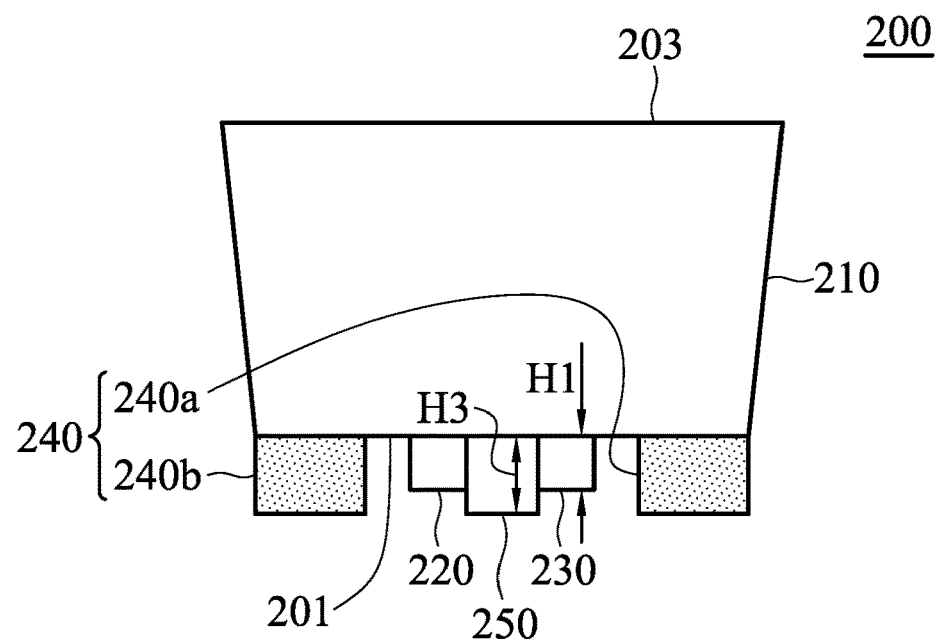
FIG. 39 is a cross-sectional view of the micro semiconductor device in accordance with some embodiments of the disclosure.
Figure 40:
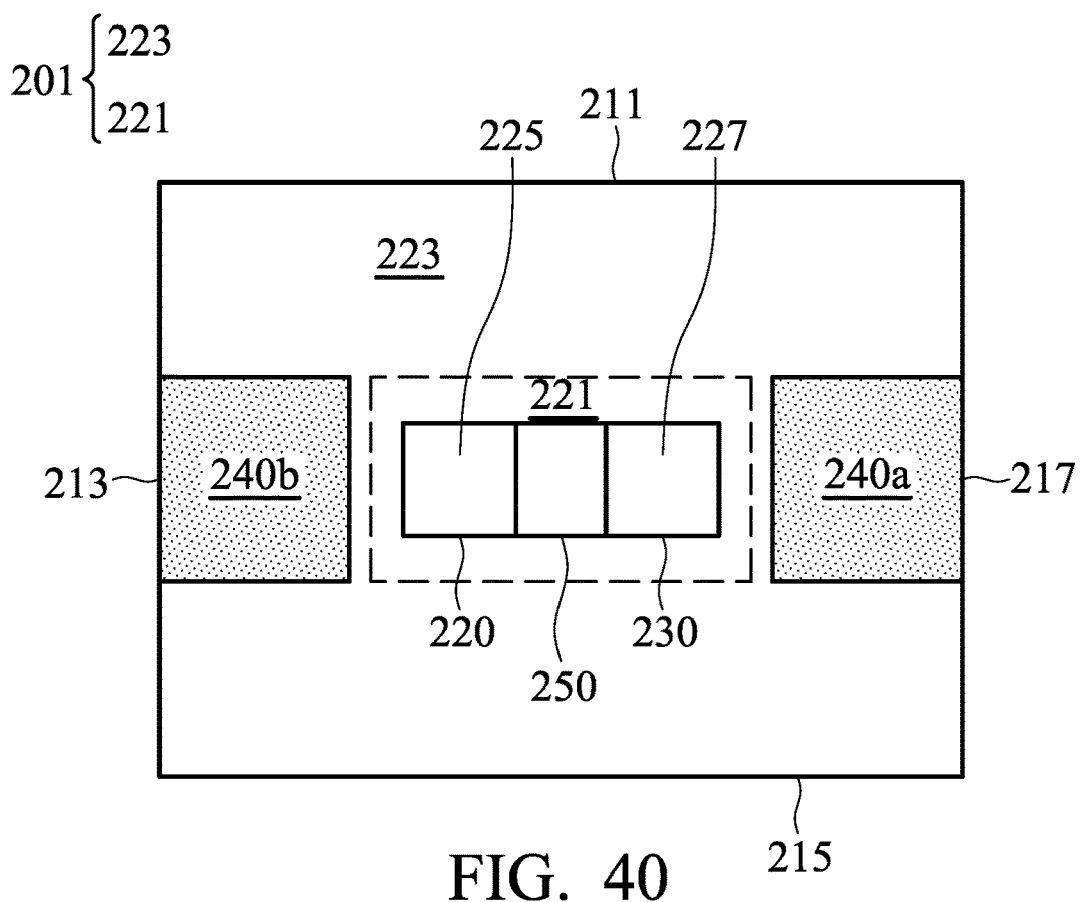
FIG. 40 is a bottom view of the micro semiconductor device of FIG. 39.
Figure 41:
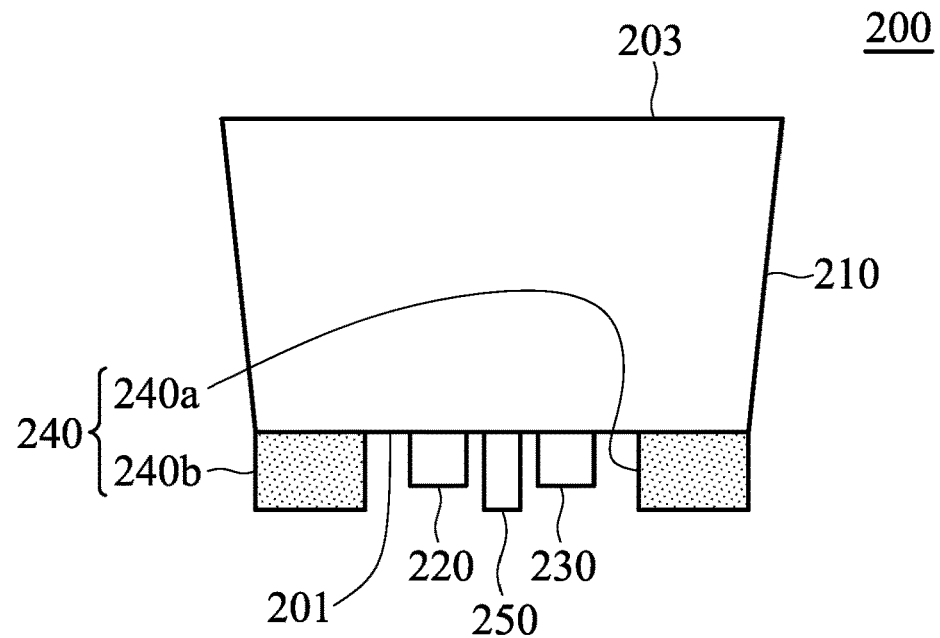
FIG. 41 is a cross-sectional view of the micro semiconductor device in accordance with some embodiments of the disclosure.

According to embodiments of the disclosure, the micro semiconductor device 200 can further include a filling layer 250 disposed on central region 221 of the bottom surface 201 of the epitaxial structure 210, as shown in FIGS. 39 and 40. According to embodiments of the disclosure, the filling layer 250 can be further disposed between the first electrode 220 and the second electrode 230, in order to prevent the first electrode 220 from electrically contacting the second electrode 230 to cause a short-circuit during the subsequent bonding process. Furthermore, the filling layer 250 can directly contact to the first electrode 220 and the second electrode 230 (as shown in FIG. 39). According to embodiments of the disclosure, the first electrode 220 does not directly contact to the first electrode 220 and the second electrode 230 (as shown in FIG. 41). According to embodiments of the disclosure, the filling layer 250 does not be disposed on the peripheral region 223, and the filling layer 250 does not directly contact with the supporting layer 240. Suitable material of the filling layer can be independently organic material (such as benzocyclobutene, phenol formaldehyde resin, epoxy resin, polyisoprene rubber or a combination thereof), inorganic material (such as silicon oxide, silicon nitride, silicon oxynitride, or a combination thereof), or a combination thereof. According to embodiments of the disclosure, the material of the filling layer 250 can be the same as or different with the material of the supporting layer 240. According to embodiments of the disclosure, the filling layer 250 of the micro semiconductor device 200 can have a third height H3. As shown in FIG. 39, the third height H3 of the filling layer 250 can be greater than the first height H1 of the first electrode 220 and the second electrode 230. Furthermore, according to embodiments of the disclosure, the third height H3 can be smaller than or equal to the first height H1. According to embodiments of the disclosure, the ratio (H1/H3) of the first height H1 to the third height H3 can be about 0.8 to 1.2, such as 0.85, 0.9, 0.95, 1.0, 1.05, 1.1, or 1.15.

Figure 42:
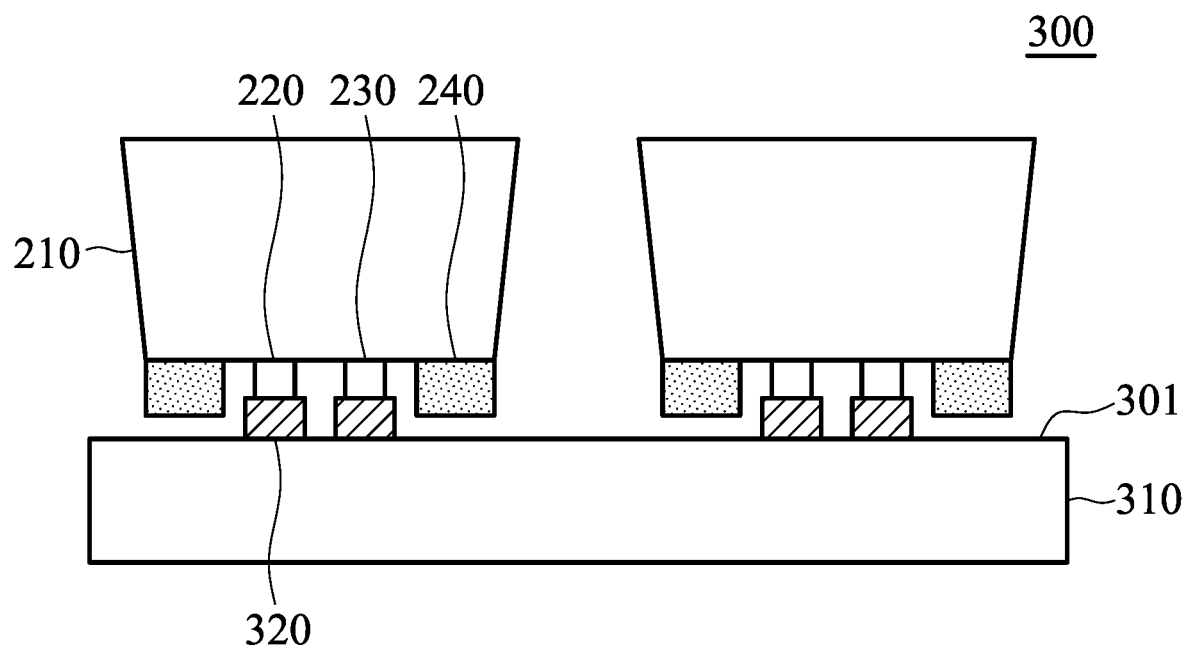
FIG. 42 is cross-sectional view of the micro semiconductor display in accordance with embodiments of the disclosure.

According to embodiments of the disclosure, the disclosure also provides a micro semiconductor display. FIG. 42 is cross-sectional view of the micro semiconductor display 300 according to embodiments of the disclosure. As shown in FIG. 42, the micro semiconductor display 300 includes a display substrate 310 and a plurality of micro semiconductor devices 200 disposed on the display substrate 310. The display substrate 310 includes a plurality of contact pads 320 disposed on a top surface 301 of the display substrate 310. Furthermore, a plurality of control circuits (not shown) can be formed on the display substrate 310 in advance. After disposing each micro semiconductor device 200 to a predetermined location, the electrodes of the micro semiconductor device 200 can contact the contact pad of the corresponding control circuit. The electrodes (such as the first electrode 220 and the second electrode 230) of the micro semiconductor device 200 can be bonded to the contact pads 320 of the display substrate 310 via a bonding process. Herein, since the micro semiconductor device of the disclosure 200 has the supporting layer 240, the overflow extension of the bonding material (i.e. the electrode of the micro semiconductor device and/or the contact pad of the display substrate), which is caused by the heating and pressing in the subsequent bonding process, can be inhibited. As a result, the leakage or short circuit problem can be avoided.

According to embodiments of the disclosure, during the bonding process for fixing the micro semiconductor device 200 on the display substrate 310, the electrode (i.e. the first electrode 220 or the second electrode 230) of the micro semiconductor device 200 can deform to increase the contact area to the contact pad 320, thereby improving the conductivity between the electrode and the contact pad.

Figure 43:
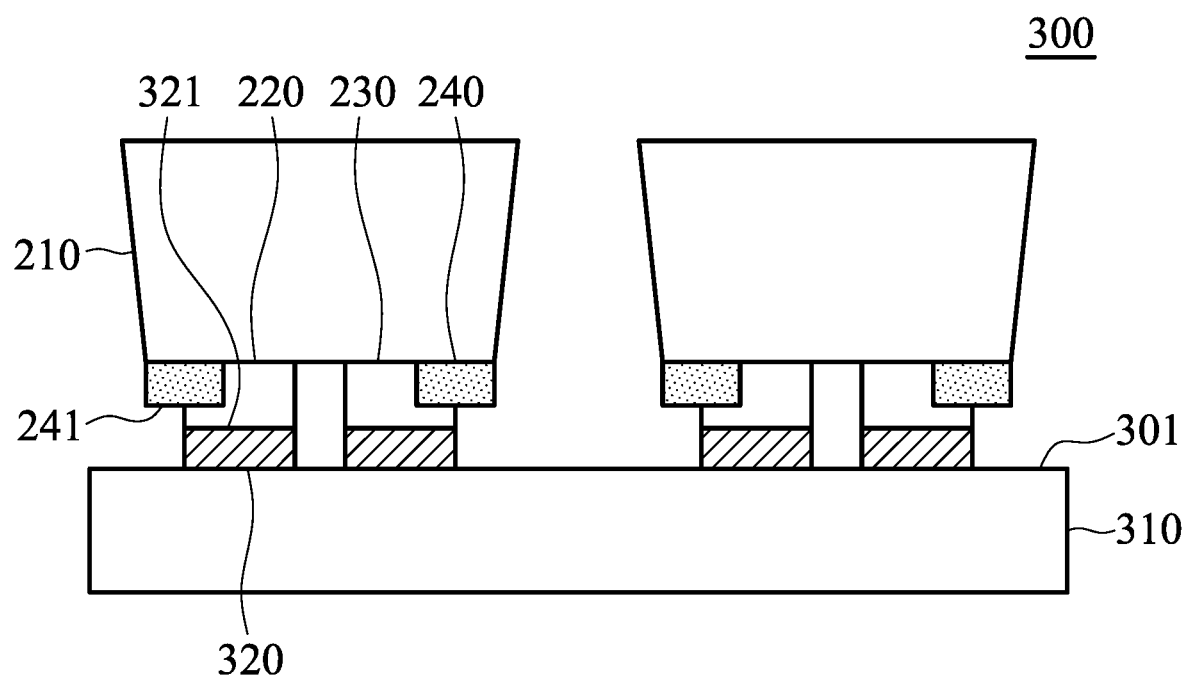
FIG. 43 is cross-sectional view of the micro semiconductor display in accordance with some embodiments of the disclosure.

FIG. 43 is cross-sectional view of the micro semiconductor display 300 according to some embodiments of the disclosure. As shown in FIG. 43, the electrode (i.e. the first electrode 220 or the second electrode 230) of the micro semiconductor device 200 can directly contact the bottom surface 241 of the supporting layer 240 and the top surface 321 of the contact pad 320. As shown in FIG. 43, the cross-section of the electrode (i.e. the first electrode 220 or the second electrode 230) of the micro semiconductor device 200 can be L-shaped. According to embodiments of the disclosure, the orthogonal projection of the supporting layer 240 of the micro semiconductor device 200 onto the display substrate 310 can overlap the orthogonal projection of the contact pad 320 onto the display substrate 310. According to embodiments of the disclosure, the orthogonal projection of the supporting layer 240 of the micro semiconductor device 200 onto the display substrate 310 does not overlap the orthogonal projection of the contact pad 320 onto the display substrate 310. According to embodiments of the disclosure, a part of the first electrode is disposed between the supporting layer and the contact pad, and the other part of the first electrode is disposed directly between the epitaxial structure and the contact pad. The orthogonal projection of the contact pad 320 onto the display substrate 310 can overlap the orthogonal projection of the supporting layer 240 onto the display substrate 310 and the orthogonal projection of the electrode (i.e. the first electrode 220 or the second electrode 230) onto the display substrate 310 simultaneously.

Although the disclosure has been described by way of example and in terms of the preferred embodiments, it should be understood that various modifications and similar arrangements (as would be apparent to those skilled in the art) can be made herein without departing front the spirit and scope of the disclosure as defined by the appended claims.

What is claimed is:

1. A micro semiconductor device, comprises:
an epitaxial structure having a bottom surface and a top surface, wherein the bottom surface is defined as a central region and a peripheral region;
a first electrode and a second electrode, wherein the first electrode and the second electrode are disposed on the central region of the bottom surface of the epitaxial structure, or the first electrode is disposed on the central region of the bottom surface of the epitaxial structure and the second electrode is disposed on the top surface of the epitaxial structure; and
a supporting layer, wherein the supporting layer is disposed on the peripheral region of the bottom surface of the epitaxial structure and the supporting layer is continuously arranged on the peripheral region, and wherein the orthogonal projection of the supporting layer onto the bottom surface of the epitaxial structure surrounds and fully encloses the central region.

2. The micro semiconductor device as claimed in claim 1, wherein the supporting layer does not contact the first electrode and the second electrode.

3. The micro semiconductor device as claimed in claim 1, the first electrode and second electrode have a first height H1, the supporting layer has a second height H2, and the ratio (H1/H2) of the first height H1 to the second height H2 is 0.8 to 1.2.

4. The micro semiconductor device as claimed in claim 1, wherein the supporting layer is discontinuously arranged on the peripheral region.

5. The micro semiconductor device as claimed in claim 4, wherein the supporting layer comprises a first portion and a second portion, and the central region is disposed between an orthogonal projection of the first portion onto the bottom surface of the epitaxial structure and an orthogonal projection of the second portion onto the bottom surface of the epitaxial structure.

6. The micro semiconductor device as claimed in claim 5, wherein the first electrode and the second electrode are disposed on the bottom surface of the epitaxial structure, an orthogonal projection of the first electrode onto the bottom surface has a first center, an orthogonal projection of the second electrode onto the bottom surface has a second center, and an orthogonal projection of the first portion onto the bottom surface of the epitaxial structure and an orthogonal projection of the second portion onto the bottom surface of the epitaxial structure simultaneously overlap an extension line passing through the first center and the second center.

7. The micro semiconductor device as claimed in claim 1, further comprising a filling layer disposed on the central region of the bottom surface of the epitaxial structure.

8. The micro semiconductor device as claimed in claim 7, wherein the first electrode and the second electrode are disposed on the bottom surface of the epitaxial structure, and the filling layer is disposed between the first electrode and the second electrode.

9. The micro semiconductor device as claimed in claim 7, wherein the filling layer directly contacts the first electrode and the second electrode.

10. The micro semiconductor device as claimed in claim 7, wherein the filling layer does not directly contact the first electrode and the second electrode.

11. The micro semiconductor device as claimed in claim 7, wherein the filling layer has a third height H3, and the ratio (H1/H3) of the first height H1 to the third height H3 is 0.8 to 1.2.

12. A micro semiconductor display, comprising:
a display substrate having a top surface;
a plurality of contact pads disposed on the top surface of the display substrate;
a plurality of the micro semiconductor devices as claimed in claim 1, wherein each of the first electrodes of the epitaxial structure is directly bonded with one of the contact pads.

13. The micro semiconductor display as claimed in claim 12, wherein a part of the first electrode is disposed between the supporting layer and the contact pad.

14. The micro semiconductor display as claimed in claim 13, wherein a cross-section of the first electrode is L-shape.

15. The micro semiconductor display as claimed in claim 12, wherein an orthogonal projection of the supporting layer onto the display substrate overlaps an orthogonal projection of the contact pad onto the display substrate.

16. The micro semiconductor display as claimed in claim 12, wherein each of the second electrodes is disposed on the central region of the bottom surface of the epitaxial structure and directly bonded with one of the contact pads.

17. The micro semiconductor display as claimed in claim 16, wherein a part of the second electrode is disposed between the supporting layer and the contact pad.

18. The micro semiconductor display as claimed in claim 17, wherein a cross-section of the second electrode is L-shape.

\* \* \* \* \*